United States Patent [19]
Tagami et al.

[11] Patent Number: 5,745,586
[45] Date of Patent: Apr. 28, 1998

[54] SOUND QUALITY CONTROL SYSTEM

[75] Inventors: Ryo Tagami, Katano; Mitsuhiko Serikawa, Nishinomiya, both of Japan

[73] Assignee: Matsushita Electric Industrial Co., Ltd., Kadoma, Japan

[21] Appl. No.: 657,930

[22] Filed: Apr. 25, 1996

[30] Foreign Application Priority Data

Apr. 25, 1995 [JP] Japan .................................. 7-125977
Aug. 3, 1995 [JP] Japan .................................. 7-198520

[51] Int. Cl.$^6$ .................................................. H03G 5/00
[52] U.S. Cl. .................................... 381/103; 381/98
[58] Field of Search .......................... 381/98, 101, 102, 381/103; 333/28 R

[56] References Cited

U.S. PATENT DOCUMENTS 5,045,802  9/1991  Miyake et al. .

FOREIGN PATENT DOCUMENTS 0 347 719  12/1989  European Pat. Off. .
0 404 474  12/1990  European Pat. Off. .
41 21 628   3/1992  United Kingdom .

OTHER PUBLICATIONS

Home and Studio Recording, Sep. 1991, pp. 40–41, Review of the Digitech MEG Dual 14 MIDI Equalizer.
Electronic Musician, Oct. 1993, pp. 105–108, "EG Workshop" by Neal Brighton and Michael Molenda.

Primary Examiner—Forester W. Isen
Attorney, Agent, or Firm—Ratner & Prestia

[57] ABSTRACT

A sound quality control system according to the present invention precisely and swiftly realizes a sound quality that is desired by a listener, by controlling sound quality based on quantitative counter model between the psychological characteristic and the physical characteristic of a sound reproduction apparatus. A quantitative counter model between the physical characteristic of a sound reproduction apparatus and a plurality of the psychological quantities upon hearing a sound therefrom is constituted for each respective psychological quantity. Based on the quantitative counter model, a desired sound quality is input to a compensation characteristics extractor, and a compensation characteristic that realizes the desired sound quality is extracted. The compensation characteristic is sent to a signal processor; and an audio signal input is processed according to the compensation characteristic, and amplified to be reproduced by a loudspeaker.

32 Claims, 18 Drawing Sheets

| Sd. No. | ADJECTIVE OF SOUND QUALITY | REGRESSION COEFFICIENT | | | | | | | | | | |
|---|---|---|---|---|---|---|---|---|---|---|---|---|
| | | CONSTANT | 32Hz | 63Hz | 125Hz | 250Hz | 500Hz | 1KHz | 2KHz | 4KHz | 8KHz | 16KHz |
| 1 | LUSTROUS –LACKLUSTER | 5.1425 | | .0651 | | .0264 | .0511 | | | –.0434 | –.0152 | –.0485 |
| 2 | BRILLIANT –DIM | 4.7816 | | .1182 | .1556 | .0523 | .1328 | | | –.0725 | –.0470 | –.0314 |
| 3 | POOR –FULL | 2.9842 | | | .1577 | | | | –.0380 | –.0693 | –.0824 | |
| 4 | FLASHY –QUIET | 3.8152 | | | .0246 | .1088 | .0698 | | –.0097 | –.1006 | –.0197 | |
| 5 | LOW–RANGE DISTINCT –L–r INDISTINCT | 4.7309 | | –.0782 | –.3090 | –.0440 | | .0576 | .0906 | .1223 | .1320 | |

FIG. 5

SOUND QUALITY CONTROL SYSTEM

FIELD OF THE INVENTION

The present invention relates to a sound quality control system for controlling the sound quality of a sound reproduction apparatus.

BACKGROUND OF THE INVENTION

A control means built into a sound reproduction apparatus for raising or lowering the gains in bass/treble or some frequency range, called a tone control or a graphic equalizer have been developed and are in use. Recently, a "pre-set menu" type equalizer adjusted to be suitable to a specific music genre, such as "jazz", "pop music", "classical music", etc. is also available. A description Follows of a prior art sound quality control system referring to the drawings.

FIG. 18 shows a constitution of a prior art sound quality control system. In FIG. 18, the gain of an audio input signal to an audio signal input means 101 is adjusted at each frequency range by a graphic equalizer 102. The signal thus adjusted is amplified by an amplifier 103 and reproduced through a loudspeaker 104. A general arrangement of the frequency range for adjustment is an interval of one octave; for example, 32 Hz, 63 Hz, 125 Hz, 250 Hz, 500 Hz, 1 KHz, 2 KHz, 4 KHz, 8 KHz, 16 KHz. A listener has to adjust the gains at each respective frequency range by hand on the graphic equalizer, in order to obtain a sound reproduction of his choice.

Graphic equalizer 102 is usually comprised of analog circuits; however, the same characteristics are implementable with an IIR (infinite impulse response) filter or a FIR (finite impulse response) filter using digital circuits.

As described above, a listener adjusts the sound quality by adjusting the gains of each frequency range using a graphic equalizer. A tone control may be used instead of using a graphic equalizer.

In a conventional method using a graphic equalizer or tone control, however, the sound quality of reproduced sound can be modified but a listener often has difficulty determining how to adjust the graphic equalizer to obtain a desired sound quality.

Most listeners are not knowledgeable about to what extent the gain of each respective frequency range needs to be adjusted in order to produce a "soft" sound, for example. As a result, a long time has to be spent to reach a desired sound quality. This is because a listener's request is a psychological quality, e.g. soft sound, powerful sound, clear sound, while conventional graphic equalizers simply offer a physical quality, e.g. 3 dB enhancement at 500 Hz, 4 dB attenuation at 4 KHz; and the counter-relationship between the two has not been made known.

SUMMARY OF THE INVENTION

According to the exemplary embodiment of the present invention, a model constituting means for constitutes a quantitative counter-relationship between the physical characteristics of a sound reproduction apparatus and the psychological quantity felt by a listener of a sound reproduced, a compensation characteristics extracting means extracts a compensation characteristic needed to compensate the sound quality of an input audio signal in accordance with the counter-relationship model, and a signal processing means processes the input audio signal and the compensation characteristic.

According to a further exemplary embodiment of the present invention, the model constituting means comprises a physical quantity input means for inputting the physical characteristic of a sound reproduction apparatus, a psychological quantity input means for inputting the psychological characteristic felt by a listener upon hearing a sound reproduced, a correlation coefficient calculation means for calculating correlationship between the physical quantity and the psychological quantity, and a counter model calculation means for calculating the quantitative counter-relationship between the physical quantity and the psychological quantity based on the correlation coefficient.

According to a further exemplary embodiment of the the present invention, the physical quantity input means inputs as the physical characteristic at least one among the deviation level and the absolute value of deviation level; where the sound pressure frequency characteristic of a sound reproduction apparatus is divided into n frequency bands, total sum of the sound pressure at each of the frequency bands divided by n is regarded as the mean sound pressure level, and difference of each frequency band from the mean sound pressure level is regarded as the deviation level.

According to a further exemplary embodiment of the present invention, the psychological quantity input means inputs as the psychological characteristic a value on the appraisal scale; where a scale between a pair of adjectives of sound quality is graded into several steps and each step is weighted by numerical value according to the graded rank to make an appraisal scale.

According to a further exemplary embodiment of the present invention, the counter model calculation means performs linear primary unification of the appraisal scales of psychological characteristic at plural deviation levels or the absolute value of the physical characteristic, and a regression formula thus obtained is employed as the quantitative counter model.

According to a further exemplary embodiment of the present invention, the compensation characteristics extracting means comprises a sound quality input means for inputting a desired sound quality in terms of the psychological quantity, and a compensation characteristic calculation means for calculating a compensation characteristic to realize a sound quality inputted from the sound quality input means based on the quantitative counter model of physical quantity and psychological quantity.

According to a further exemplary embodiment of the present invention, the compensation characteristic calculation means shifts the physical characteristic in each column of the regression formula at a same rate.

According to a further exemplary embodiment of the present invention, the compensation characteristic calculation means shifts the physical characteristic in each column of the regression formula by weighting with the value of regression coefficient.

According to a further exemplary embodiment of the present invention, the compensation characteristic calculation means shifts the control quantity in each frequency band by weighting with the correlation coefficient between the physical characteristic and psychological characteristic.

According to a further exemplary embodiment of the present invention, the compensation characteristics extracting means comprises a sound quality input means for inputting a desired sound quality, a compensation characteristic calculation means for calculating a compensation characteristic to realize a sound quality inputted from the sound quality input means based on the quantitative counter model between the physical quantity and the psychological quantity, and a compensation characteristic setting means for setting a compensation characteristic to realize the sound quality inputted from the sound quality input means.

According to a further exemplary embodiment of the present invention, the compensation characteristic calculation means shifts the physical characteristic in the regression formula at a same rate.

According to a further exemplary embodiment of the present invention, the compensation characteristic calculation means shifts the physical characteristic in each column of the regression formula by weighting with the value of regression coefficient.

According to a further exemplary embodiment of the present invention, the compensation characteristic calculation means shifts the control quantity of each frequency band by weighting with the value of correlation coefficient between the physical quantity and the psychological quantity.

According to a further exemplary embodiment of the present invention, the compensation characteristic setting means comprises a memory section for recording plural compensation characteristics and corresponding sound qualities, and a selection means for selecting one characteristic from the memory section.

According to a further exemplary embodiment of the present invention, the compensation characteristic setting means comprises a memory section for recording plural compensation characteristics and corresponding sound qualities, a selection means for selecting at least more than two characteristics from the memory section, and an interpolation means for interpolating the plural compensation characteristics selected by the selection means and calculating a compensation characteristic to realize the sound quality set by the sound quality input means.

According to a further exemplary embodiment of the present invention, the sound quality input means inputs at least more than two categories of sound quality each on different appraisal scale irrelevant to each other.

According to a further exemplary embodiment of the present invention, the sound quality input means inputs a value on the appraisal scale as the sound quality; where a scale between a pair of adjectives of sound quality is graded into several steps and each step is weighted by numerical value according to the graded rank to make an appraisal scale.

According to a further exemplary embodiment of the present invention, the sound quality input means inputs at least more than one category of sound quality.

According to a further exemplary embodiment of the present invention, the sound quality input means inputs at least more than two categories of sound quality each on different appraisal scale irrelevant to each other.

According to a further exemplary embodiment of the present invention, the sound quality display means displays at least more than one-dimensional appraisal scale, or a two-dimensional plane and a three-dimensional space constituted by appraisal scales of more than two categories, or both of the aforementioned two, and a sound quality inputted from said sound quality input means, on real-time and simultaneous basis.

According to a further exemplary embodiment of the present invention, a sound quality input means inputs a desired sound quality in terms of value on the psychological category scale, a sound quality memory section recordings said inputted sound quality, a sound quality selection means selectings said sound quality recorded, and a sound quality display means displayings said inputted sound quality on real-time basis.

According to a further exemplary embodiment of the present invention, the sound quality input means inputs a value on the appraisal scale as the sound quality; where a scale between a pair of adjectives of sound quality is graded into several steps and each step is weighted by numerical value according to the graded rank to make an appraisal scale.

According to a further exemplary embodiment of the present invention, the sound quality input means inputs at least more than one category of sound quality.

According to a further exemplary embodiment of the present invention, the sound quality input means inputs at least more than two categories of sound quality each on different appraisal scale irrelevant to each other.

According to a further exemplary embodiment of the present invention, the sound quality display means displays at least more than one one-dimensional appraisal scale, or a two-dimensional plane and a three-dimensional space constituted by appraisal scales of more than two categories, or both of the aforementioned two, and a sound quality inputted from said sound quality input means, on real-time and simultaneous basis.

According to a further exemplary embodiment of the present invention, a sound quality input means inputs a desired sound quality, a sound quality memory section recordings said inputted sound quality, a sound quality selection means selects said sound quality recorded, a sound quality display means displays said inputted sound quality on real-time basis, and a compensation characteristic display means displays a compensation characteristic to realize the sound quality inputted.

According to a further exemplary embodiment of the present invention, the sound quality input means inputs a value on the appraisal scale as the sound quality; where a scale between a pair of adjectives of sound quality is graded into several steps and each step is weighted by numerical value according to the graded rank to make an appraisal scale.

According to a further exemplary embodiment of the present invention, the sound quality input means inputs at least more than one category of sound quality.

According to a further exemplary embodiment of the present invention, the sound quality input means inputs at least more than two categories of sound quality each on different appraisal scale irrelevant to each other.

According to a further exemplary embodiment of the present invention, the sound quality display means displays at least more than one one-dimensional appraisal scale, or a two-dimensional plane and a three-dimensional space constituted by appraisal scales of more than two categories, or both of the aforementioned two, and a sound quality inputted from said sound quality input means, on real-time and simultaneous bases.

According to a further exemplary embodiment of the present invention, a compensation characteristic input means inputs a compensation characteristic, a compensation characteristic memory section recordings said inputted compensation characteristic, a compensation characteristic selection means selectings said compensation characteristic recorded, a control means sets the inputted compensation characteristic on sound quality control means, a sound quality calculation means calculats a sound quality based on data of said compensation characteristic, and a sound quality display means displays said calculated sound quality on real-time basis.

According to a further exemplary embodiment of the present invention, the compensation characteristic input means inputs a datum for compensating the amplitude frequency characteristic of input signal.

According to a further exemplary embodiment of the present invention, the sound quality calculation means calculates a sound quality using a regression formula wherein the sound quality is represented in a form of linear primary unification of the physical characteristics.

According to a further exemplary embodiment of the present invention, the regression formula treats a value on the appraisal scale as the sound quality; where a scale between a pair of adjectives of sound quality is graded into several steps and each step is weighted by numerical value according to the graded rank to make an appraisal scale.

According to a further exemplary embodiment of the present invention, the regression formula treats at least one among the difference in sound pressure at each frequency band from the mean sound pressure level and the absolute value as the physical characteristic; where the amplitude frequency characteristic of compensation characteristic inputted from the compensation characteristic input means is divided into n frequency bands, total sum of the sound pressure at each of the frequency bands divided by n is regarded as the mean sound pressure level.

According to a further exemplary embodiment of the present invention, the sound quality display means displays at least more than one one-dimensional appraisal scale, or a two-dimensional plane and a three-dimensional space constituted by appraisal scales of more than two categories, or both of the aforementioned two, and a sound quality inputted from said sound quality input means, on real-time and simultaneous basis.

With the above described constitution, the present invention precisely realizes a desired sound quality, because control is performed based on a quantitative counter-relationship model between the physical characteristic (physical quantity) of a sound reproduction apparatus and the psychological characteristic (psychological quantity).

A highly precise counter-relation model can be constituted if a sound pressure frequency characteristic most influential to the sound quality is used as the physical quantity of the quantitative counter model.

Further, a desired sound quality can be realized precisely, and swiftly if a compensation characteristic based on quantitative counter model and the corresponding psychological quantity are recorded as a pair in the memory section.

Further, a desired sound quality can be realized more precisely if an interpolation is conducted using plural compensation characteristics.

A listener is not requested to control the physical characteristics of sound quality; by a simple operation of inputting a desired sound quality, the sound quality is realized precisely and swiftly.

Further, by recording an inputted sound quality in the memory section, a sound quality that was realized in the past can be reproduced again by a simple operation.

Further, by the display of a compensation characteristic for realizing an inputted sound quality, the psychological effect regarding the sound quality control is enhanced by the visual effect.

When controlling the physical characteristic, as with a conventional graphic equalizer, the present control system calculates a sound quality of the time and displays it on real-time basis; this helps realize a desired sound quality within a short time span.

BRIEF DESCRIPTION OF THE DRAWINGS

FIG. 5 shows an exemplary regression coefficient to each of the adjectives of sound quality.

DESCRIPTION OF THE PREFERRED EMBODIMENTS

In the following, a first embodiment of the present invention is described referring to Figures.

Figure 1:
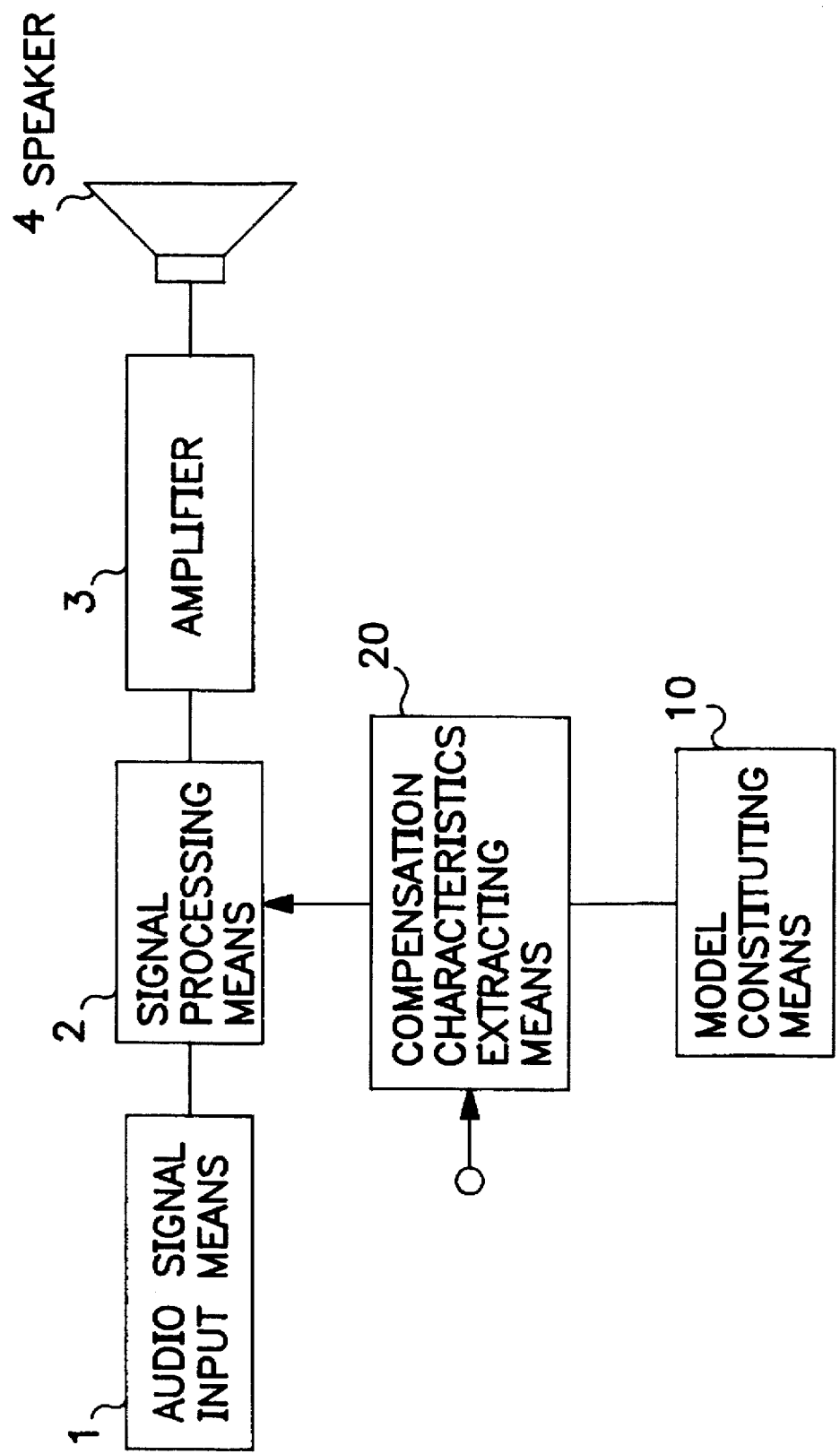
FIG. 1 is a block diagram showing basic constitution of a sound quality control system according to a first embodiment of the present invention.

FIG. 1 is a block diagram showing the basic constitution of a sound quality control system according to a first embodiment of the present invention. In FIG. 1, numeral 1 denotes an audio signal input means, 2 a signal processing means, 3 an amplifier, 4 a loudspeaker, 10 a model constituting means, and 20 a compensation characteristics extracting means.

In the model constituting means 10, a quantitative counter model between the physical characteristic of a sound reproduction apparatus and a plurality of the psychological qualities (impressions) inspired upon hearing (listening) a sound therefrom is constituted. The counter model is a relationship between the psychological quantity and the physical quantity expressed in a numerical formula; and which is constituted for each psychological quantity.

Based on the quantitative counter model, a desired sound quality is input to compensation characteristics extracting means 20, and compensation characteristics extracting means 20 extracts a compensation characteristic for realizing the desired sound quality. The compensation characteristic thus extracted by compensation characteristics extracting means 20 is sent to signal processing means 10. An audio input signal from audio signal input means 1 is processed according to a compensation characteristic sent to signal processing means 2, and reproduced through amplifier 3 by loudspeaker 4. In most of the cases, signal processing means 2 is an analog graphic equalizer; however, similar results are obtainable by the use of a digital circuit IIR type filter, or FIR type filter.

As described above, by controlling the sound quality using a compensation characteristic which is based on a quantitative counter model between the physical quantity and the psychological quantity, a sound quality desired by a listener is precisely reproduced.

Figure 2:
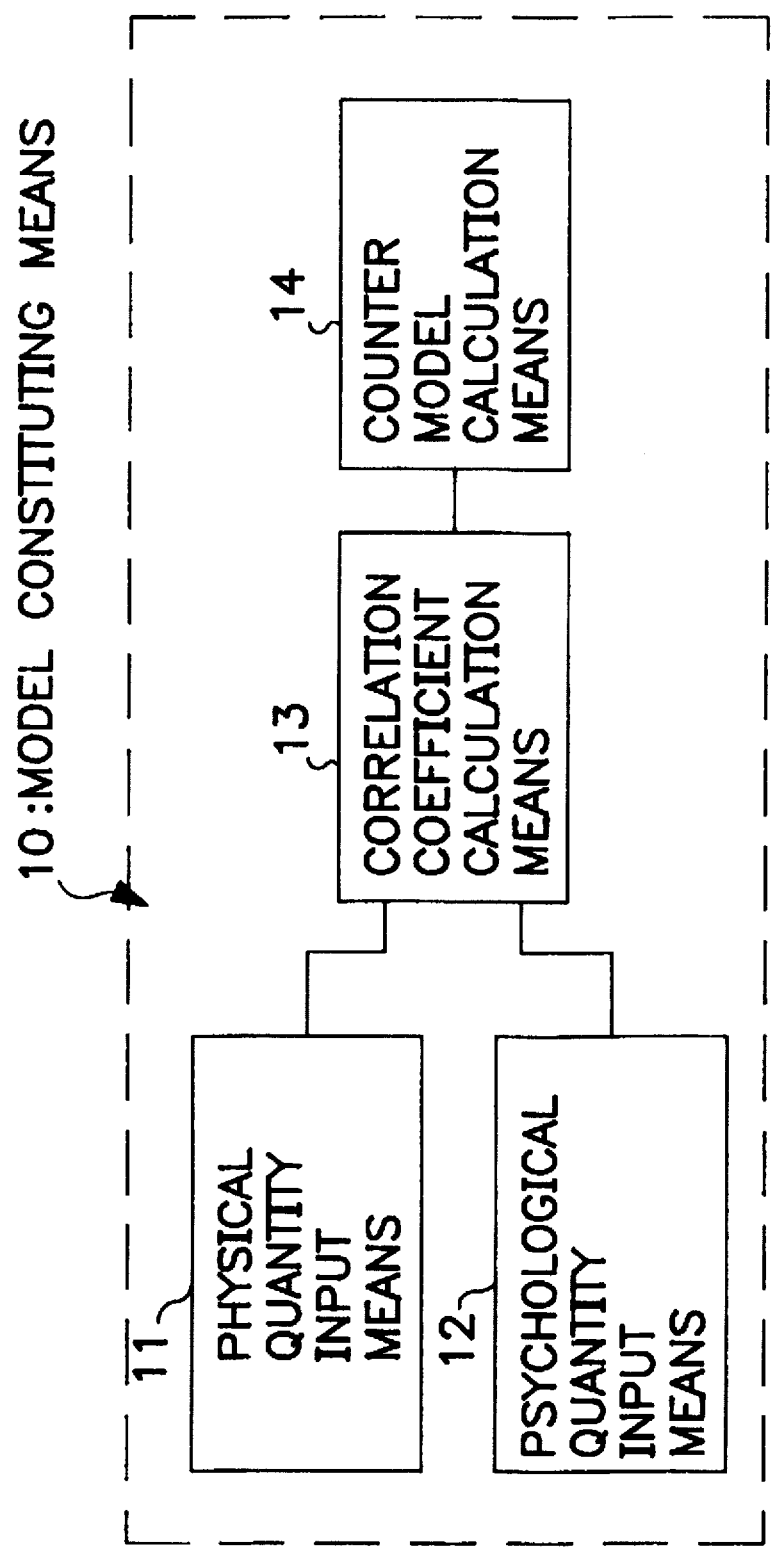
FIG. 2 is a block diagram showing basic constitution of a model constituting means provided in a sound quality control system of the first embodiment.

Next, model constituting means 10 is described more in detail. FIG. 2 is a block diagram showing the basic constitution of model constituting means 10.

Numeral 11 denotes a physical quantity input means, 12 a psychological quantity input means, 13 a correlation coefficient calculation means, and 14 a counter model calculation means.

In physical quantity input means 11, various sound pressure frequency characteristics of plural sound reproduction apparatus are input. Here, a frequency range from 20 Hz to 20 KHz is divided into n frequency bands (in this case, 10 bands). The difference between the level of each frequency band and the mean sound pressure level, which is the sum of the sound pressures of all frequency bands divided by n, (hereinafter referred to as deviation level) is input together with the absolute values.

The level differences in the frequency bands, with 32 Hz, 64 Hz, 125 Hz, 250 Hz, 500 Hz, 1 KHz, 2 KHz, 4 KHz, 8 KHz, 16 KHz as the center frequency of each respective band, are input together with the absolute values thereof, totaling 20 types of physical quantities. The number of frequency bands and the center frequency of each frequency range are not limited to those exemplified here.

Figure 3:
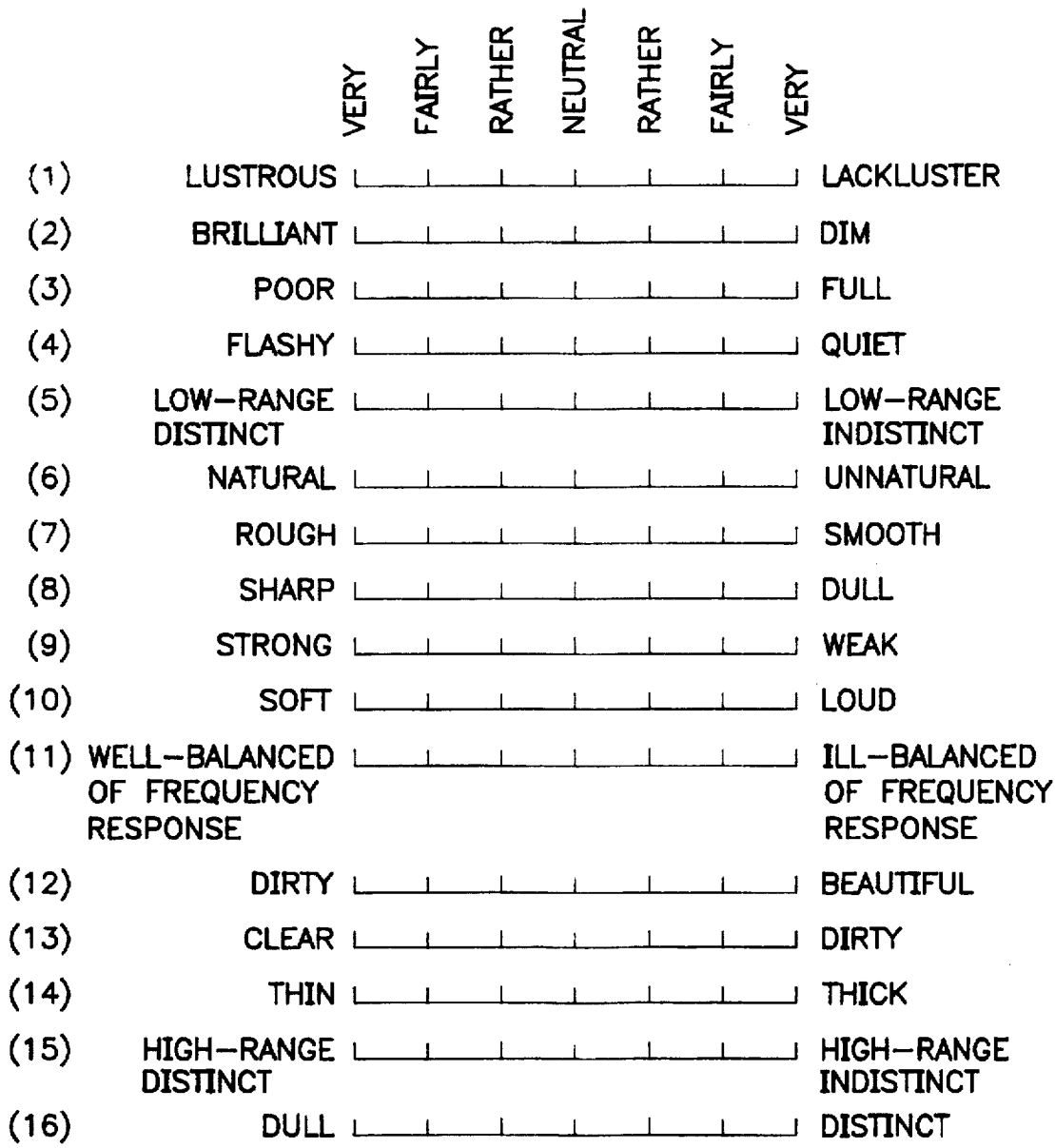
FIG. 3 explains a sound quality appraisal sheet by adjectives of sound quality.

Psychological quantity input means 12 inputs a psychological quantity felt by a listener upon listening to a sound reproduced by the sound reproduction apparatus having a physical characteristic input into physical quantity input means 11. FIG. 3 shows an example of an appraisal sheet used for listener evaluation; here, evaluation by a 7-step SD(semantic differential) method is prepared for 16 pairs of sound quality adjectives. The SD method is an evaluation method in which a scale between a pair of sound quality adjectives is graded into several steps with semantic words (very flashy, fairly flashy, rather flashy, neutral, rather quiet, fairly quiet, very quiet).

Each of the seven evaluation steps is given with marks from 1 to 7, and an evaluated mark is input to psychological quantity input means 12. (hereinafter, those shown in FIG. 3 are called as psychological category scale.) When there are plural evaluators, a general practice is to input their mean value.

Although the number of psychological quantity categories is 16 here, the number may be either more or less. In addition, a factor of sound quality extracted from a result obtained through appraisal with plural pairs of sound quality adjectives and by applying, to the result, the factor analysis may be used as the psychological category scale; and the results of the listening evaluation by the scale, may be input to psychological quantity input means 12. The factor analysis is a method of statistical processing, with which the sound quality adjectives having similar implication among the plural adjectives are integrated into one, and as a result factors of sound quality independent to each other can be extracted. Thus, when factors of sound quality obtained through the factor analysis are used, the psychological quantity to be input to psychological quantity input means 12 decreases; and the burden of listening appraisal is lowered.

By the factor analysis, adjectives of sound quality such as flashy-quiet, high frequency range distinct-high frequency range indistinct, dull-distinct, sharp-dull, brilliant-dim, clear-dirty, lustrous-lackluster, etc. are integrated into a clarity factor; low frequency range distinct-low frequency range indistinct, thin-thick, poor-full, strong-weak, soft-loud, etc. into a powerfulness factor; and natural-unnatural, frequency response well-balanced-frequency response ill-balanced, rough-smooth, dirty-beautiful, etc. into a beauty factor.

Plural physical quantities and psychological quantities input to physical quantity input means 11 and psychological quantity input means 12 are calculated by correlation coefficient calculation means 13 to obtain a correlation coefficient between the two. Here, the correlation coefficient between each respective adjective of sound quality and physical quantity of each frequency band is calculated. From the results, a certain frequency band which is influenced by a sound quality adjective is known, and a rough correlationship can be expressed with the correlation coefficient.

Figure 4:
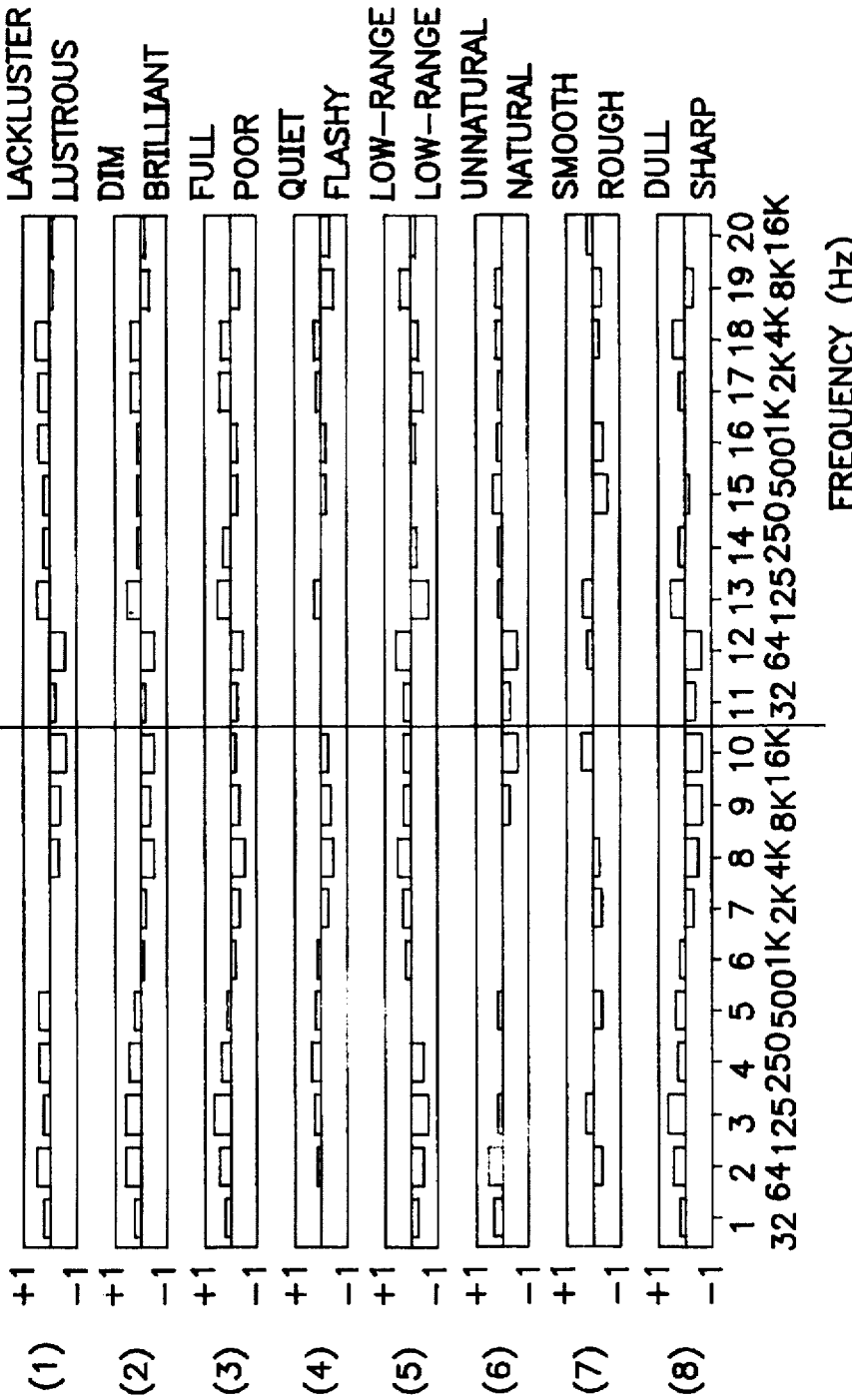
FIGS. 4(a) and 4(b) show exemplary correlation coefficients of physical characteristic to each of the adjectives of sound quality.

FIGS. 4(a) and 4(b) show examples of data analyzed in each frequency band for the correlation coefficient at each respective sound quality adjective. Numerals 1–10 and 11–20 on the horizontal axis indicate frequency bands. Values on the vertical axis for 1–10 indicate a correlation coefficient between the deviation level and the psychological quantity of each adjective of sound quality in the frequency bands having the center frequency of each respective band at 32 Hz, 64 Hz, 125 Hz, 250 Hz, 500 Hz, 1 KHz, 2 KHz, 4 KHz, 8 KHz, and 16 KHz. Likewise, values on the vertical axis for 11–20 indicate a correlation coefficient between the absolute value of the deviation level and the psychological quantity of each sound quality adjective in the frequency bands having the center frequency of each respective band at 32 Hz, 64 Hz, 125 Hz, 250 Hz, 500 Hz, 1 KHz, 2 KHz, 4 KHz, 8 KHz, and 16 KHz.

Counter model calculation means 14 shown in FIG. 2 is a means for calculating a quantitative counter model between the physical quantity and the psychological quantity using the above correlation coefficient. In this quantitative counter model, the psychological quantity Z becomes a regression formula represented as linear primary unification of the physical quantity X; where the deviation level or the absolute value in each frequency band is treated as the physical quantity X. A general formula of this regression formula is shown as the following formula (1):

$$Z = a_0 + a_1 X_1 + a_2 X_2 + \ldots + a_i X_i \tag{1}$$

In counter model calculation means 14, the regression constant column $a_0$ in formula (1) and the regression coefficient ai to the physical quantity at band i are calculated. Where, i corresponds to the number of frequency bands. In this way, a quantitative counter model as represented by the regression formula (1) is constituted from the plural physical qualities and psychological qualities input.

FIG. 5 shows an example of a table of coefficients used for the regression formula. On each line of FIG. 5, a sound quality adjective is described, followed by the constant column and the regression coefficient at each frequency band. For example, in item (5) "Low frequency range distinct-indistinct", the coefficient has the largest negative value at 125 Hz, and each of the coefficients from 63 Hz to 250 Hz is negative. This means that in the psychological quantity "low frequency range indistinct", the elements in 63 Hz–250 Hz bear the negative correlationship. This is because of a fact explained earlier in FIG. 3, that the psychological quantity of each sound quality adjective is handled in such a manner that an adjective in the right carries with it a larger value (positive direction in the right). Accordingly, when the sound pressure in the frequency bands 63 Hz–250 Hz becomes larger, it tends to go towards "low frequency range distinct". A fact that each of the coefficients in 1 KHz–8 KHz is positive means that when the level in these bands becomes larger, it tends to go towards "low frequency range indistinct".

This coefficient is obtained as a result of calculating the results of the listening test. In a typical expression, the physical characteristic, in this case the sound pressure level, is shifted by each frequency band. The listeners evaluate the change of psychological quantity on a specific psychological scale, and mark the evaluation sheet. The results of listening test by a number of listeners are calculated. In practice, a combination of the changes in physical quantities at plural frequency bands is presented to the test listeners for appraisal.

Figure 6A:
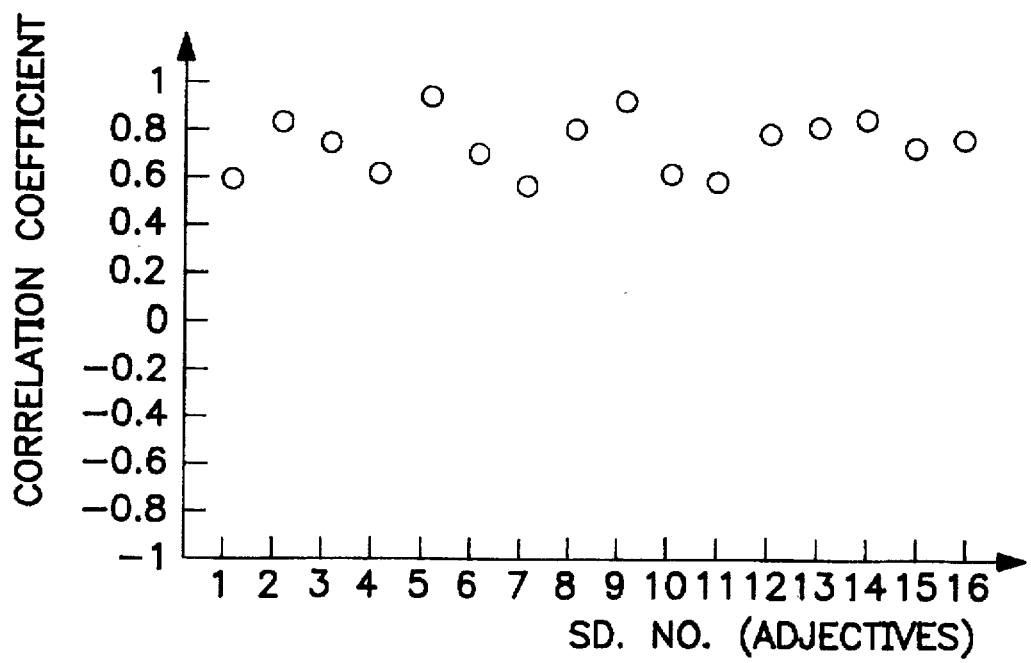
FIGS. 6(a) and 6(b) show exemplary results of a calculation by the counter model calculation means of the first embodiment.
Figure 6B:
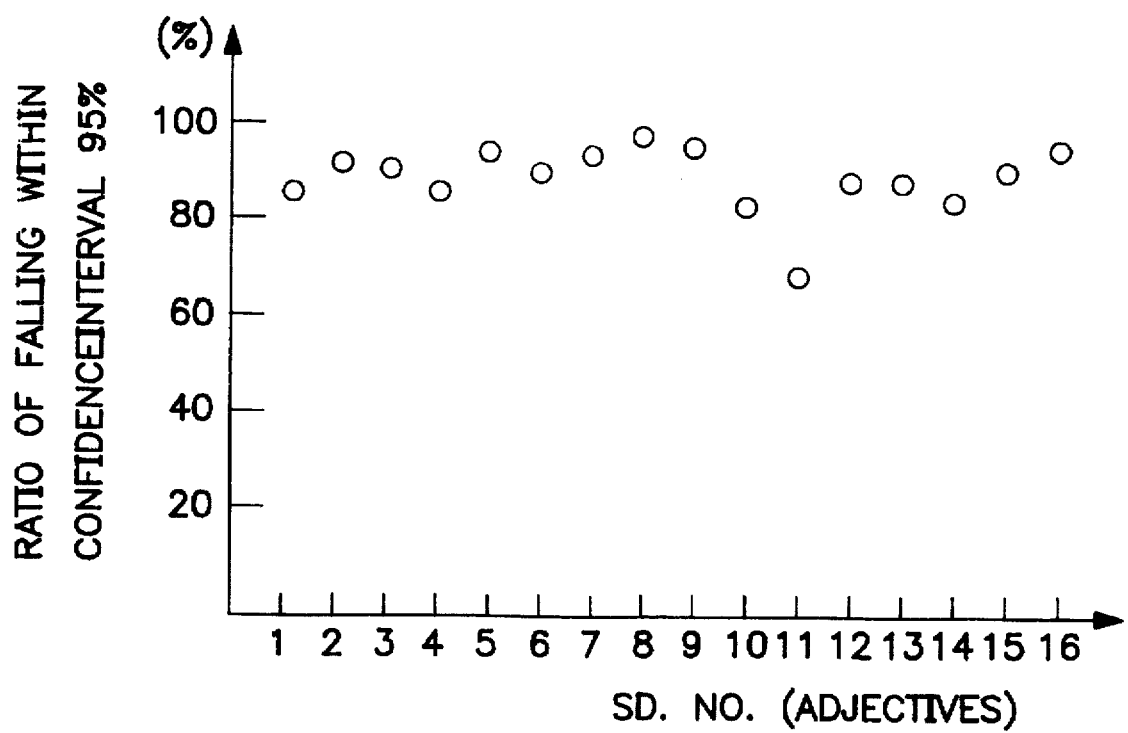

FIGS. 6(a) and 6(b) compare estimated sound qualities calculated using a regression formula constituted by the counter model calculation means and results of actual measurement in the experimental psychological evaluation. FIG. 6(a) shows the correlation coefficient between the actual measurement value in experimental psychological evaluation and the estimated sound quality value by the regression formula. FIG. 6(b) shows a proportion of samples where the estimated sound quality values fall within the confidence interval 95% of actual measurement results. The horizontal axis of FIGS. 6(a) and 6(b) indicate the number of sound quality adjectives. There are 50 samples for each sound quality adjective. The results show that the correlation coefficient is higher than 0.6 in every sound quality adjective, which is statistically meaningful with a critical rate of 1%. As to the proportion of samples that fall within the 95% confidence interval, although item (11) "well-balanced—ill-balanced of frequency response" (ref. FIG. 3) is approximately 70%, other sound quality adjectives have an accuracy as high as over 84%, as shown in FIG. 6(b).

As described above, because of the use of sound pressure frequency characteristics, among other physical characteristics, which is most influential to the sound quality, a counter model has been constituted with a very high accuracy.

Although a frequency range is divided at one octave intervals into 10 frequency bands in this exemplary case, it may be divided at a finer interval, e.g. ⅓ octave, if many samples are available with respect to the sound frequency characteristic; then the accuracy of the counter model is further increased. Or, a critical band width may be used to be closer to the human auditory mechanism.

Next, description is made on an embodiment, wherein the compensation characteristics extracting means 20 is made to be further practical.

Figure 7:
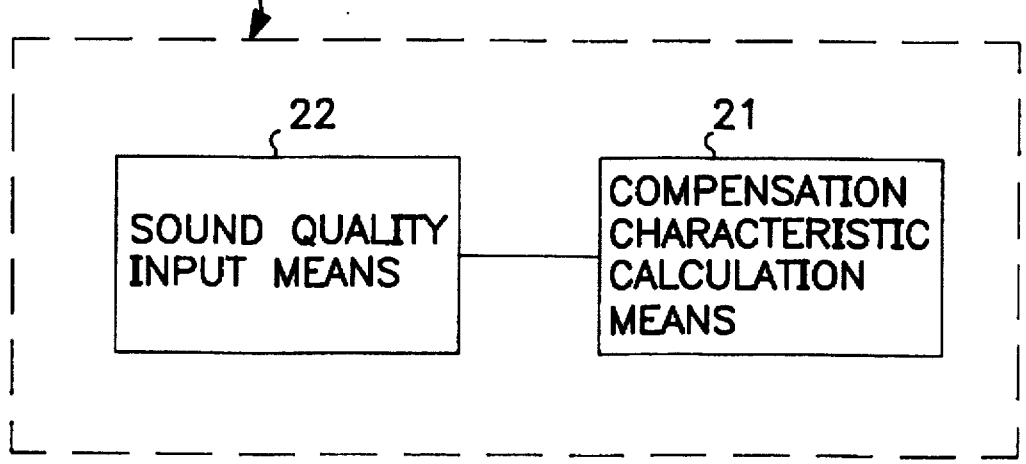
FIG. 7 is a block diagram showing basic constitution of a first compensation characteristics extracting means provided in a sound quality control system of the first embodiment.

FIG. 7 is a block diagram showing the basic constitution of a first compensation characteristics extracting means 20A. In FIG. 7, numeral 21 denotes a compensation characteristic calculation means, and 22 a sound quality input means.

When sound quality input means 22 receives a signal of a desired sound quality, compensation characteristic calculation means 21 calculates a compensation characteristic for realizing the sound quality by using the quantitative counter model constituted. For the calculation method, there is a method wherein the physical quantity used in the regression formula is shifted at a same rate, a method wherein the shifting is weighted with the regression coefficient of regression formula, and a method wherein the shifting is weighted with the correlation coefficient of physical quantity and psychological quantity.

For example, suppose a regression formula representing the feeling of powerfulness given by formula (2):

$$Z = 2.0 X125 + 1.0 X250 - 3.0 X4K \qquad (2)$$

where, Z is the psychological quantity representing the feeling of powerfulness, X125 is the deviation level at the 125 Hz frequency band, X 250 is the deviation level at the 250 Hz frequency band, and X4K is the deviation level at the 4 KHz frequency band.

First, a case where the physical quantity is shifted at a fixed rate is contemplated. In order to shift by 6 the feeling of powerfulness Z in the positive direction, raise the 125 Hz and the 250 Hz bands by 1 dB from the present characteristic, and damp the 4 KHz band by 1 dB. Thus, by controlling three frequency bands at a same level (1 dB), the targeted feeling of powerfulness is realized.

Next, a case where the shifting is weighted by the regression coefficient is contemplated. Here, each of the frequency bands is controlled in the sequence from the one that bears the largest influence on the sound quality to be controlled. As formula (2) shows, the ratio of the regression coefficient on the frequency bands 125 Hz, 250 Hz and 4 KHz is 2:1:3, so the physical quantities are also shifted in line with the ratio. In order to shift the feeling of powerfulness Z by 2.8 towards the positive direction, raise the 125 Hz band by 0.4 dB, and the 250 Hz band by 0.2 dB, and damp the 4 KHz band by 0.6 dB from the present frequency characteristic.

The same idea also applies in a case of weighting with the correlation coefficient. For example, suppose the regression formula regarding the feeling of powerfulness is the formula (2), and the correlation coefficient between each respective frequency band and the feeling of powerfulness takes the following value (−1<correlation coefficient R<1):

Correlation coefficient at 125 Hz $R125 = 0.4$
Correlation coefficient at 250 Hz $R250 = 0.3$
Correlation coefficient at 4 KHz $R4K = -0.5$ In this case, the ratio of the correlation coefficient R at 125 Hz, 250 Hz and 4 KHz is 0.4:0.3:0.5, so the physical quantities are also shifted in line with the ratio.

For example, in order to shift the feeling of powerfulness by 5.2 towards the positive direction, raise the 125 Hz band by 0.8 dB and the 250 Hz band by 0.6 dB, and damp the 4 KHz band by 1.0 dB from the present frequency characteristic. The calculation procedure is as follows:

$Z = 2.0 \times 0.8 + 1.0 \times 0.6 - 3.0 \times (-1.0) = 5.2$

As described above, a compensation characteristic for realizing a desired sound quality is set with high precision, because the compensation characteristic is calculated based on the quantitative counter model between the physical quantity and the psychological quantity.

Now in the following, a second compensation characteristic extracting means 20B is described.

Figure 8:
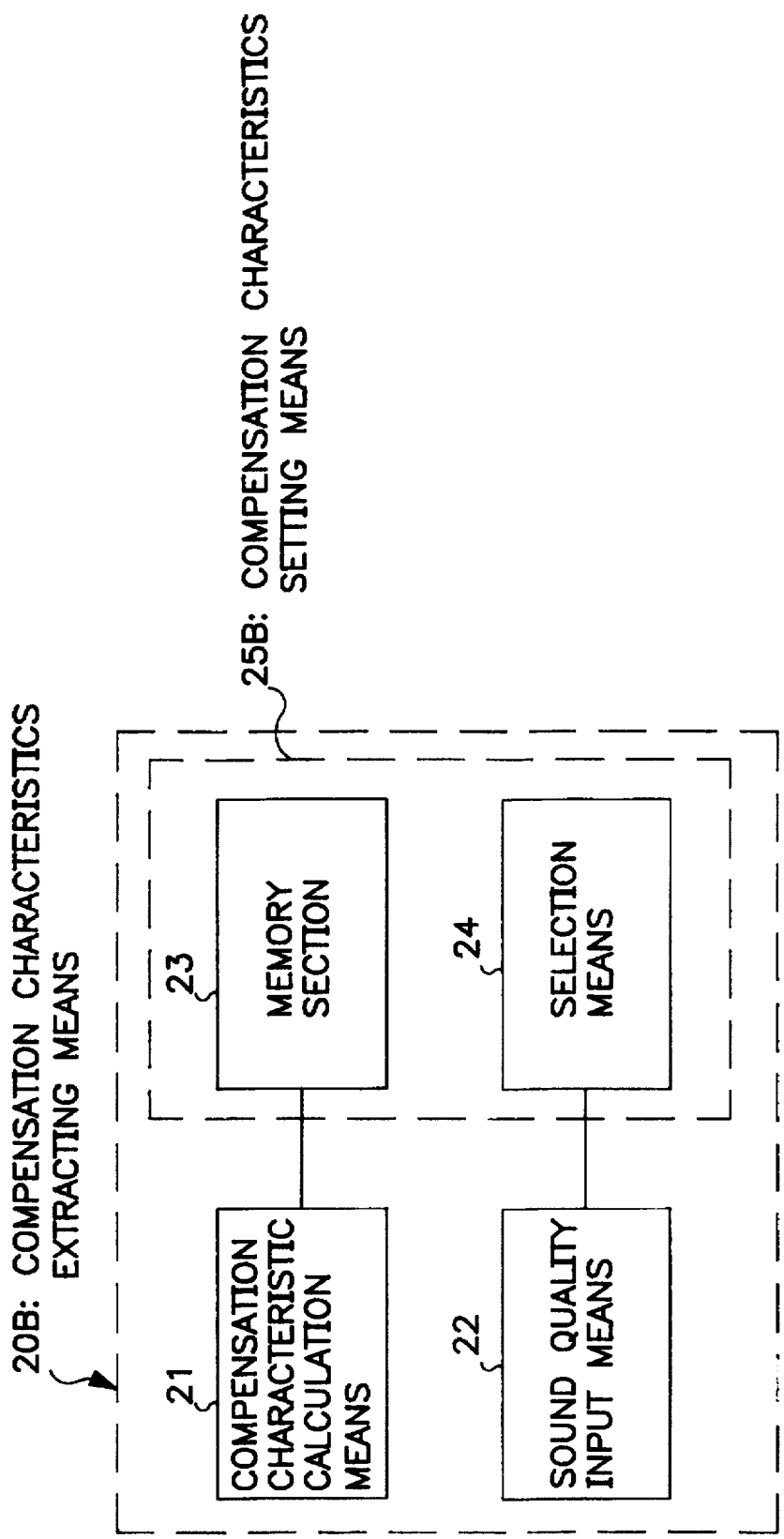
FIG. 8 is a block diagram showing basic constitution of a second compensation characteristics extracting means provided in a sound quality control system of the first embodiment.

FIG. 8 is a block diagram showing the basic constitution of a second compensation characteristic extracting means 20B. In FIG. 8, numeral 21 denotes a compensation characteristic calculation means, 22 a sound quality input means, 23 a memory section, 24 a selection means, and 25B a compensation characteristic setting means.

Compensation characteristic calculation means 21 is, like the one in FIG. 7, a means for calculating compensation characteristics to realize varieties of sound qualities. Memory section 23 is a memory for recording a compensation characteristic calculated in compensation characteristic calculation means 21 and the sound quality as a pair. The method of calculating the compensation characteristic remains the same as the one described above.

Selection means 24 is a means for selecting, upon input of a desired sound quality in sound quality input means 22, a compensation characteristic to realize the sound quality out of memory section 23. Signal processing means 2 of FIG. 1 controls the sound quality using a compensation characteristic selected by compensation characteristics extracting means 20B.

As described above, a compensation characteristic for realizing a desired sound quality can be set within a short period of time with high precision. This is because a compensation characteristic calculated in advance based on the quantitative counter model between the physical quantity and the psychological quantity is recorded together with the corresponding sound quality as a pair in memory section 23.

Now in the following, a third compensation characteristics extracting means 20C is described.

Figure 9:
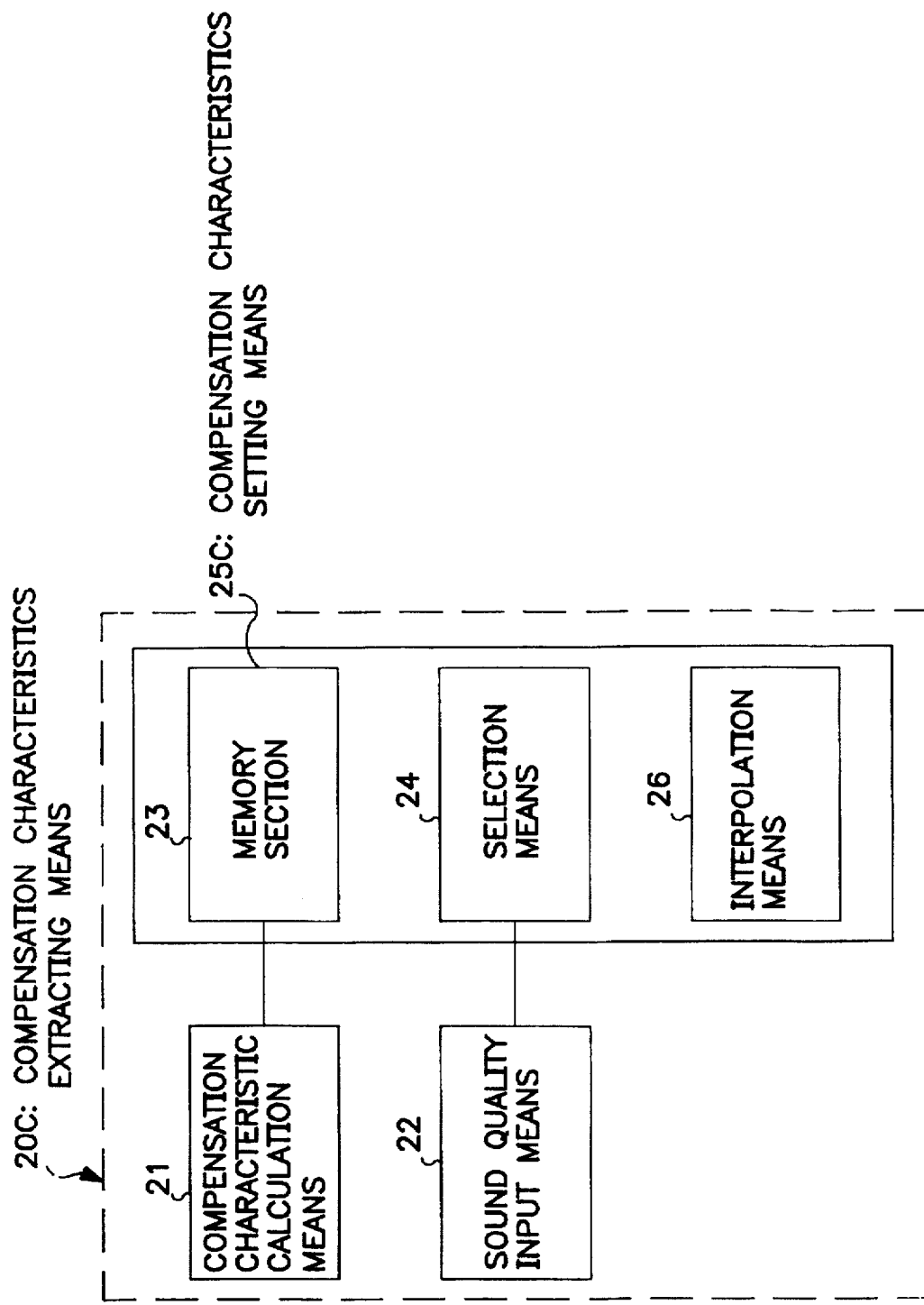
FIG. 9 is a block diagram showing basic constitution of a third compensation characteristics extracting means provided in a sound quality control system of the first embodiment.

FIG. 9 is a block diagram showing the basic constitution of a compensation characteristics extracting means 20C. In FIG. 9, numeral 21 denotes a compensation characteristic calculation means, 22 a sound quality input means, and a compensation characteristic setting means 25 is comprised of a memory section 23, a selection means 24 and an interpolation means 26.

Similar to the second compensation characteristics extracting means 20B, in a third compensation characteristics extracting means 20C, compensation characteristics for realizing varieties of sound qualities are calculated in advance by compensation characteristic calculation means 21, and the sound quality and the compensation characteristic are recorded in pairs in memory section 23. The method of calculating the compensation characteristic remains the same as in the first compensation characteristics extracting means 20A.

When sound quality input means 22 receives a desired sound quality, selection means 24 selects out of memory section 23 a compensation characteristic for realizing the sound quality. In a case when the inputted sound quality does not exist in the memory section, selection means 24 picks up two kinds of compensation characteristics, e.g. the nearest value above and below that of the sound quality. Interpolation means 26 calculates a final compensation characteristic by interpolating the two kinds of compensation characteristics. In the calculation, a linear interpolation is usually practiced; however, other interpolation methods may of course be used. Signal processing means 2 controls the sound quality using the final compensation characteristic calculated by means of interpolation. Although in this case the interpolation calculation is conducted using two kinds of compensation characteristics nearest to the inputted sound quality, the calculation may use more than two kinds of compensation characteristics.

As described above, because a compensation characteristic, calculated based on a quantitative counter model between the physical quantity and the psychological quantity, is recorded in advance together with the corresponding sound quality in pairs, and a compensation characteristic is calculated by a simple interpolation process, a compensation characteristic for realizing the inputted sound quality can be set with higher precision within a short period of time.

Figure 10:
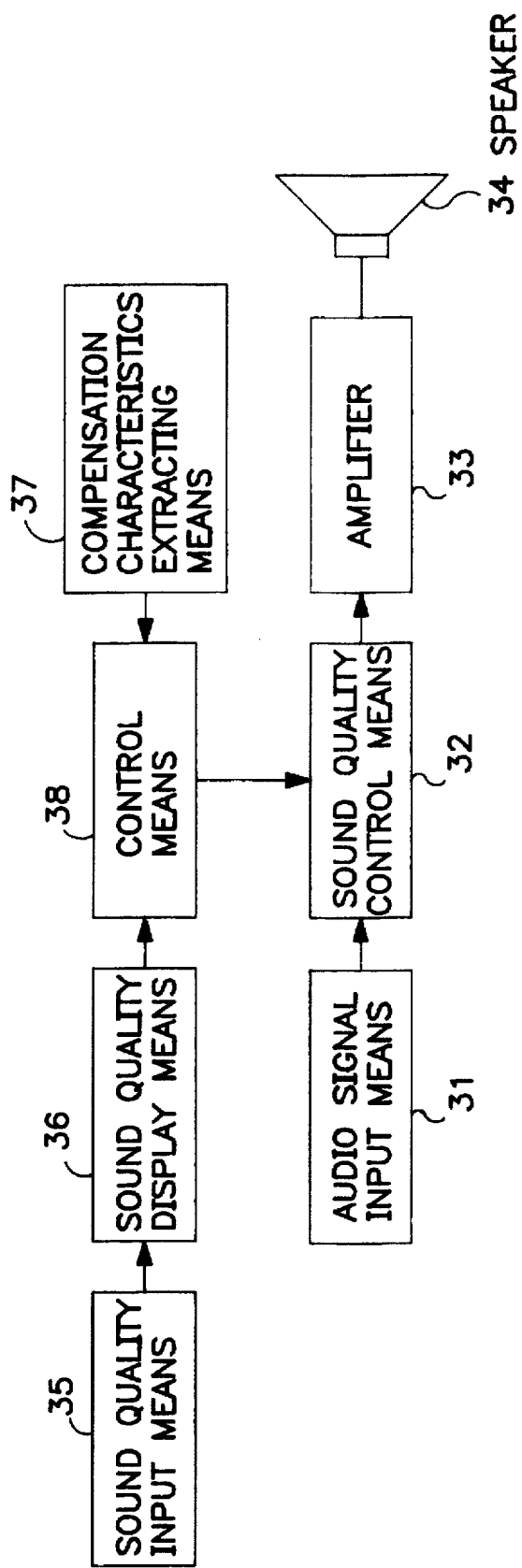
FIG. 10 is a block diagram showing basic constitution of a sound quality control system according to a second embodiment of the present invention.

FIG. 10 is a block diagram showing the basic constitution of a second embodiment of the present invention. In FIG. 10, numeral 31 denotes an audio signal input means, 32 a sound quality control means, 33 an amplifier, 34 a loudspeaker, 35 a sound quality input means, 36 a sound quality display means, 37 a compensation characteristics extracting means, and 38 a control means.

A listener inputs a desired sound quality to sound quality input means 35 referring to the psychological category scale displayed by sound quality display means 36. The inputted sound quality is displayed on sound quality display means 36 at the same time.

Figure 11:
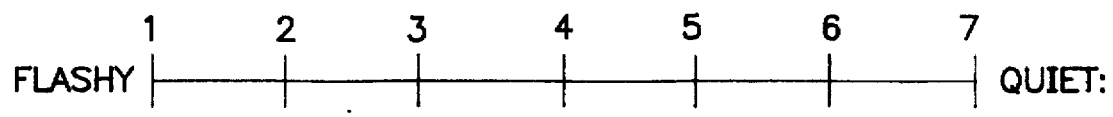
FIG. 11 shows an example of a psychological category.

FIG. 11 shows an example of a psychological category scale. The sound quality is input with a scale value on the psychological category scale. In this example, the scale value is disposed at an equal interval ranging from mark 1 to mark 7; however, any marks would do in so far as they are ordinal scales.

The sound quality adjectives used on the psychological category scale are exemplified in FIG. 3. The factor of sound quality obtained by applying the factor analysis may be used instead. The plural psychological category scales extracted through the factor analysis turn out to be irrelevant to each other.

Figure 12:
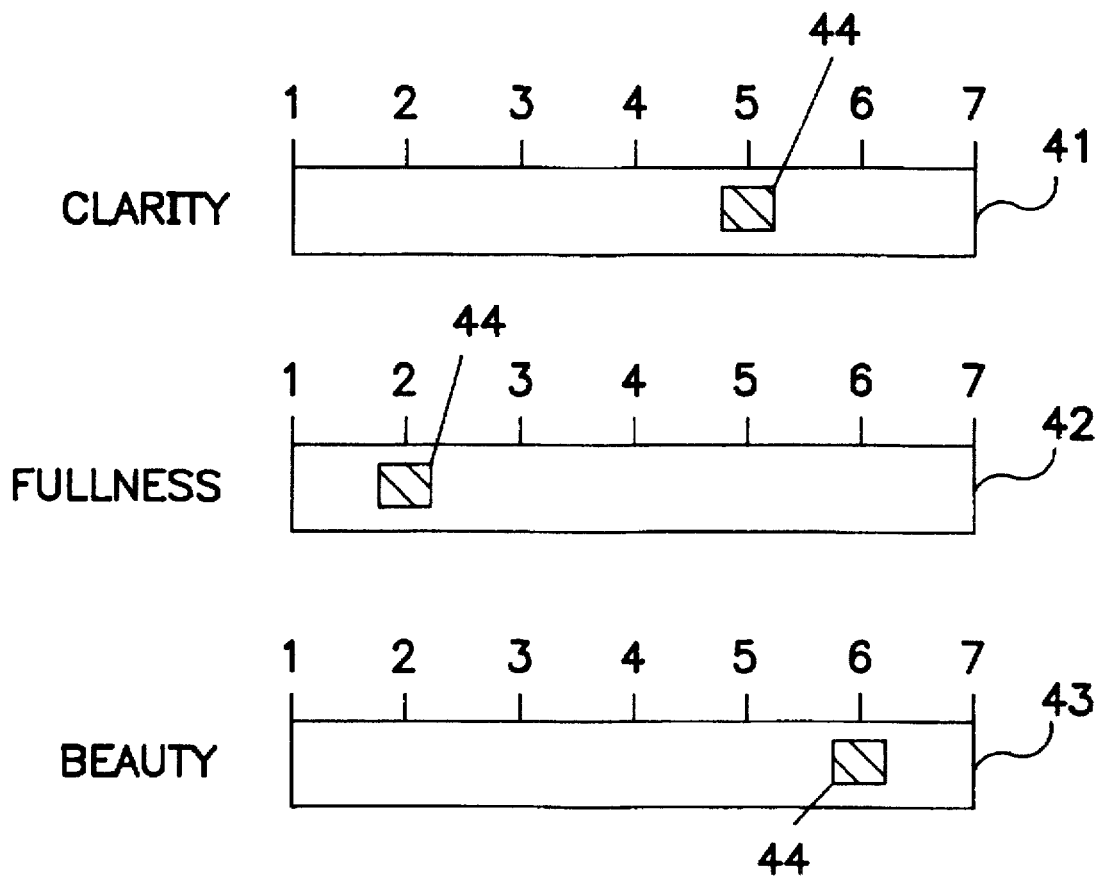
FIG. 12 shows an example of a sound quality display means.
Figure 13:
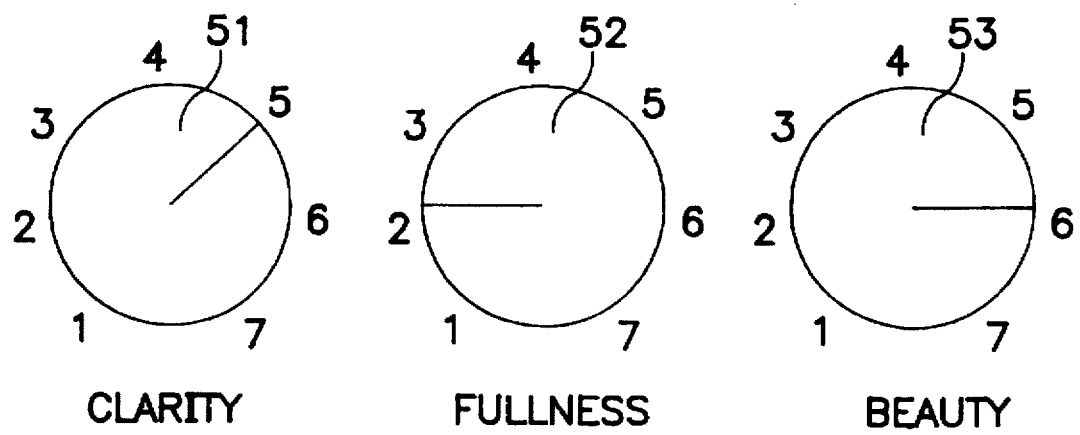
FIG. 13 shows an example of a sound quality input means.

FIG. 12 shows an example of a sound quality display means. In FIG. 12, numerals 41, 42 and 43 denote psychological category scales 44 and a location of an inputted sound quality. Here, the three psychological category scales are displayed independently. Scale 41 is a psychological category scale related to the clarity brilliance and flashyness, and is named "Clarity". Scale 42 is a psychological category scale related to the fullness and thickness, and is named "Fullness". Scale 43 is a psychological category scale related to the beauty and balance, and is named "Beauty". These three types of scales have been obtained by applying the factor analysis to the results of the sound quality appraisal using the sound quality adjectives in FIG. 3; these psychological category scales are unrelated to each other. A listener may designate a sound quality with a joystick, mouse, etc. on each respective psychological category scale displayed. On the other hand, as shown in FIG. 13, the sound quality may be input by means of a rheostat corresponding to each psychological category scale. In FIG. 13, numeral 51 denotes a rheostat for controlling the sound quality on the psychological category scale regarding the clarity, 52 a rheostat for controlling the sound quality on the psychological category scale regarding the fullness, and 53 a rheostat for controlling the sound quality on the psychological category scale regarding the beauty. In FIG. 13, the clarity is set at mark 5, the fullness at mark 2, and the beauty at mark 6.

Figure 14:
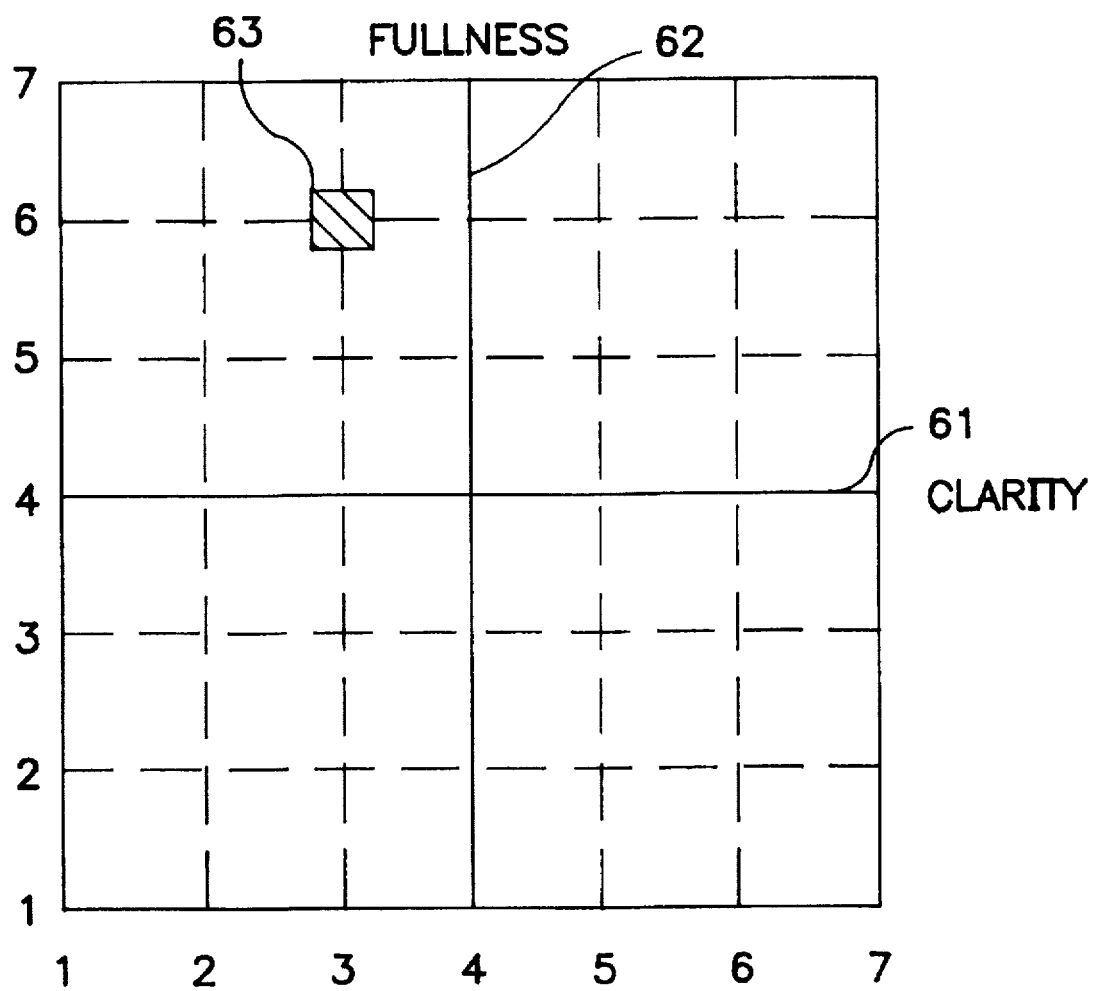
FIG. 14 shows an example of a sound quality display means.

FIG. 14 shows another example of a sound quality display means. In FIG. 14, numerals 61 and 62 designate a psychological category scale, and 63 a location of an input sound quality. In this case, a two-dimensional plane constituted by the two types of psychological category scales, and the location of an inputted sound quality are shown on the plane. Horizontal axis 61 is the psychological category scale of e.g. clarity, and vertical axis 62 is the psychological category scale of e.g. fullness. The input of a sound quality is performed by designating the coordinates displayed on the two-dimensional plane with a mouse, joystick, etc. In FIG. 14, the clarity is set at mark 3, and the fullness at mark 6.

Thus, by displaying a plane constituted by the psychological category scales, and an inputted sound quality at a same time on real-time basis, it enables a listener to input a desired sound quality with a simple operation.

In the above, a case of one-dimensional appraisal scale and display in two-dimensional plane is exemplified; however, the display may be conducted with a three-dimensional space constituted by three psychological category scales, or with a combination thereof.

As described above, a listener inputs a desired sound quality by using sound quality input means 35 while referring to sound quality display means 36. Compensation characteristics extracting means 37 extracts a compensation characteristic corresponding to the inputted sound quality. The compensation characteristic is extracted based on a regression formula, wherein the sound quality is expressed in the form of a linear primary unification with the amplitude frequency characteristic. For example, suppose a regression formula regarding the fullness is represented by formula (3).

$$W = 2.0 X125 - 1.0 X4K - 1.0 X8K \quad (3)$$

where, W is a psychological quantity related to fullness, X125 is a deviation level in the 125 Hz frequency band, X4K is a deviation level in the 4 KHz frequency band, and X8K is a deviation level in the 8 KHz frequency band.

In order to make the fullness to be mark 4 on the fullness scale, raise the 125 Hz band by 1 dB, lower the 4 KHz band by 1 dB and lower the 8 KHz by 1 dB. Although many other calculation methods are available, a method of controlling the frequency bands used in the regression formula by a fixed gain is employed in the present case.

Other methods include, as described in the first embodiment, a method of applying weights based on the regression coefficient and the correlation coefficient between each frequency band and the sound quality (in this case, the fullness). Such methods that mainly control the frequency bands have great influence on the sound quality. As an example, a method of weighting with the regression coefficient is described below. Where a regression formula regarding fullness is expressed by formula (3), the ratio of the regression coefficient on the 125 Hz, 4 KHz, and 8 KHz bands is 2:1:1; and the level of each respective frequency band is shifted according to the value of the ratio. Namely, in order to make the fullness to be mark 6 on the fullness scale, raise the 125 Hz band by 2 dB, lower the 4 KHz band by 1 dB, and lower the 8 KHz band by 1 dB. The same idea applies in a case where the weighting is done with the correlation coefficient.

As another example, suppose a regression formula regarding the fullness and the clarity is expressed by formula (4). This is a formula for obtaining the physical characteristic from the sound quality of fullness and clarity, while formula (3) is used to obtain the sound quality from each physical characteristic.

$$\begin{aligned} X125 &= aW + bZ \\ X250 &= cW + dZ \\ X500 &= eW + fZ \\ X1K &= gW + hZ \\ X2K &= iW + jZ \\ X4K &= kW + lZ \\ X8K &= mW + nZ \\ X16K &= oW + pZ \end{aligned} \quad (4)$$

where, W represents the psychological quantity of fullness, and
Z represents the psychological quantity of clarity.
X125 is the deviation level in the 125 Hz frequency band
X250 is the deviation level in the 250 Hz frequency band
X500 is the deviation level in the 500 Hz frequency band
X1K is the deviation level in the 1 KHz frequency band
X2K is the deviation level in the 2 KHz frequency band
X4K is the deviation level in the 4 KHz frequency band
X8K is the deviation level in the 8 KHz frequency band
X16K is the deviation level in the 16 KHz frequency band,
and a,b,c,d,e,f,g,h,i,j,k,l,m,n,o,p are coefficients.

The physical characteristic of each frequency band is obtainable by putting desired marks of fullness and clarity into formula (4). The calculation with formula (4) is simpler, as compared with formula (3). Calculation results corresponding to plural sound qualities may be put into the memory in advance. And a compensation characteristic extracted is sent to sound quality control means 32 by control means 38. In the mean time, the sound quality of a signal input in audio signal input means 31 is controlled by sound quality control means 32 in accordance with a compensation characteristic set by control means 38. The signal is then amplified by amplifier 33 and reproduced by loudspeaker 34.

Figure 15:
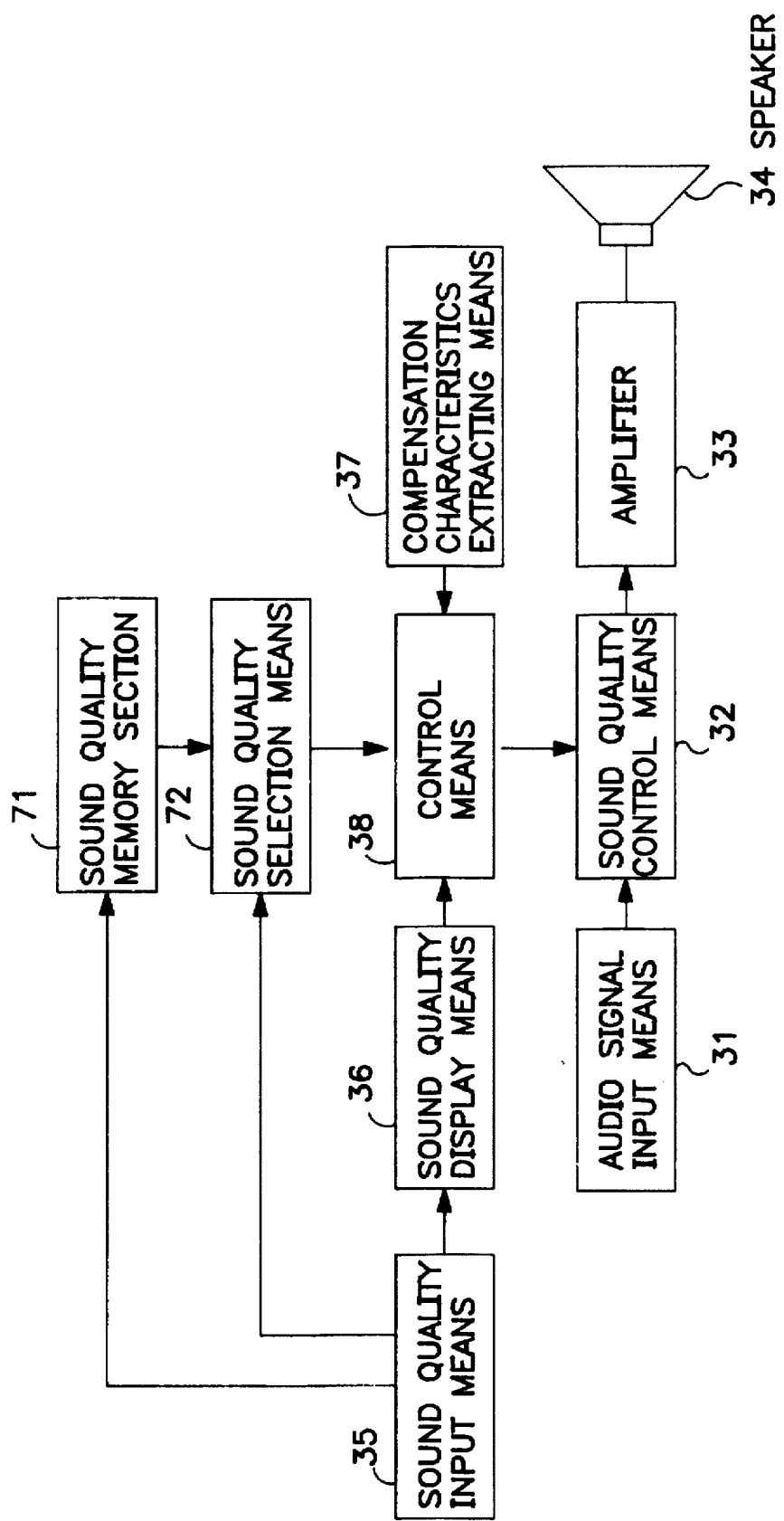
FIG. 15 is a block diagram showing basic constitution of a sound quality control system according to a third embodiment of the present invention.

A third embodiment of the present invention is described as follows referring to the drawings. FIG. 15 is a block diagram showing the basic constitution of a third embodiment of the present invention.

In FIG. 15, numeral 31 denotes an audio signal input means, 32 a sound quality control means, 33 an amplifier, 34 a loudspeaker, 35 a sound quality input means, 36 a sound quality display means, 37 a compensation characteristics extracting means, 38 a control means, 71 a sound quality memory section, and 72 a sound quality selection means.

As described in the second embodiment, a listener inputs a desired sound quality in terms of a sound quality scale, for example, the clarity with mark 3 and the fullness with mark 6, using sound quality input means 35. Whenever necessary, the listener records the inputted sound quality in sound quality memory section 71. The sound quality memory section 71 is capable of recording plural sound qualities. When the listener selects a recorded sound quality using sound quality selection means 72, a compensation characteristic corresponding to the sound quality is sent to sound quality control means 32; sound quality is thus controlled.

A case where a listener varies the sound quality in accordance with the type of music to be reproduced is now described. Suppose a listener's favorite sound is, for example, classical music with a clarity of 2 marks and a fullness of 4 marks; for pop music with a clarity of 5 marks and a fullness of 5 marks; and for jazz music with a clarity of 3 marks and a fullness of 4 marks. These values of sound quality, scaled together with their corresponding names (in this case: classical, pops, jazz), are put into sound quality memory section 71. By selecting a name already memorized in sound quality memory section 71 with sound quality selection means 72, a listener can readily have a sound quality that was used in the past. In this case, a sound quality is selected by the name of the kind of music to be reproduced; however, the means of selection is not limited to names.

As described above, by having plural inputted sound qualities memorized for later selection, a sound quality that was once used in the past can be used again with a simple operation.

Figure 16:
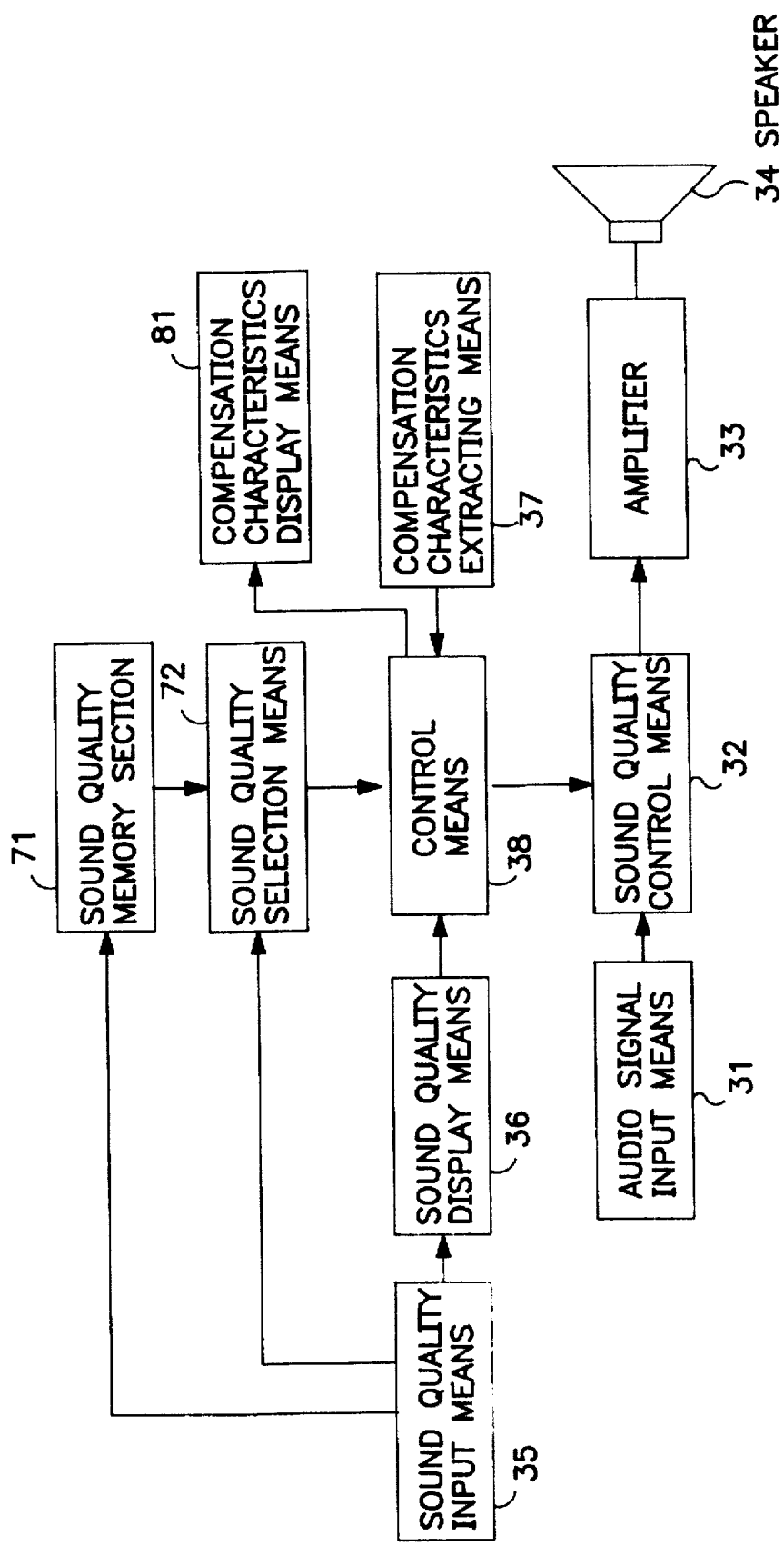
FIG. 16 is a block diagram showing basic constitution of a sound quality control system according to a fourth embodiment of the present invention.

Now in the following, a fourth embodiment of the present invention is described referring to Figures. FIG. 16 is a block diagram showing the basic constitution of a fourth embodiment of the present invention.

In FIG. 16, numeral 31 denotes an audio signal input means, 32 a sound quality control means, 33 an amplifier, 34 a loudspeaker, 35 a sound quality input means, 36 a sound quality display means, 37 a compensation characteristics extracting means, 38 a control means, 71 a sound quality memory section, 72 a sound quality selection means, and 81 a compensation characteristic display means.

A listener controls the sound quality in the same manner as in the second embodiment and the third embodiment. In addition, a compensation characteristic for realizing the inputted sound quality is displayed by compensation characteristic display means 81 on a real-time basis.

As described above, a listener can visually confirm how the compensation characteristics change when a sound quality is input. Thus, the psychological effects regarding the sound quality control is enhanced.

Next, a fifth embodiment of the present invention is described referring to Figures.

Figure 17:
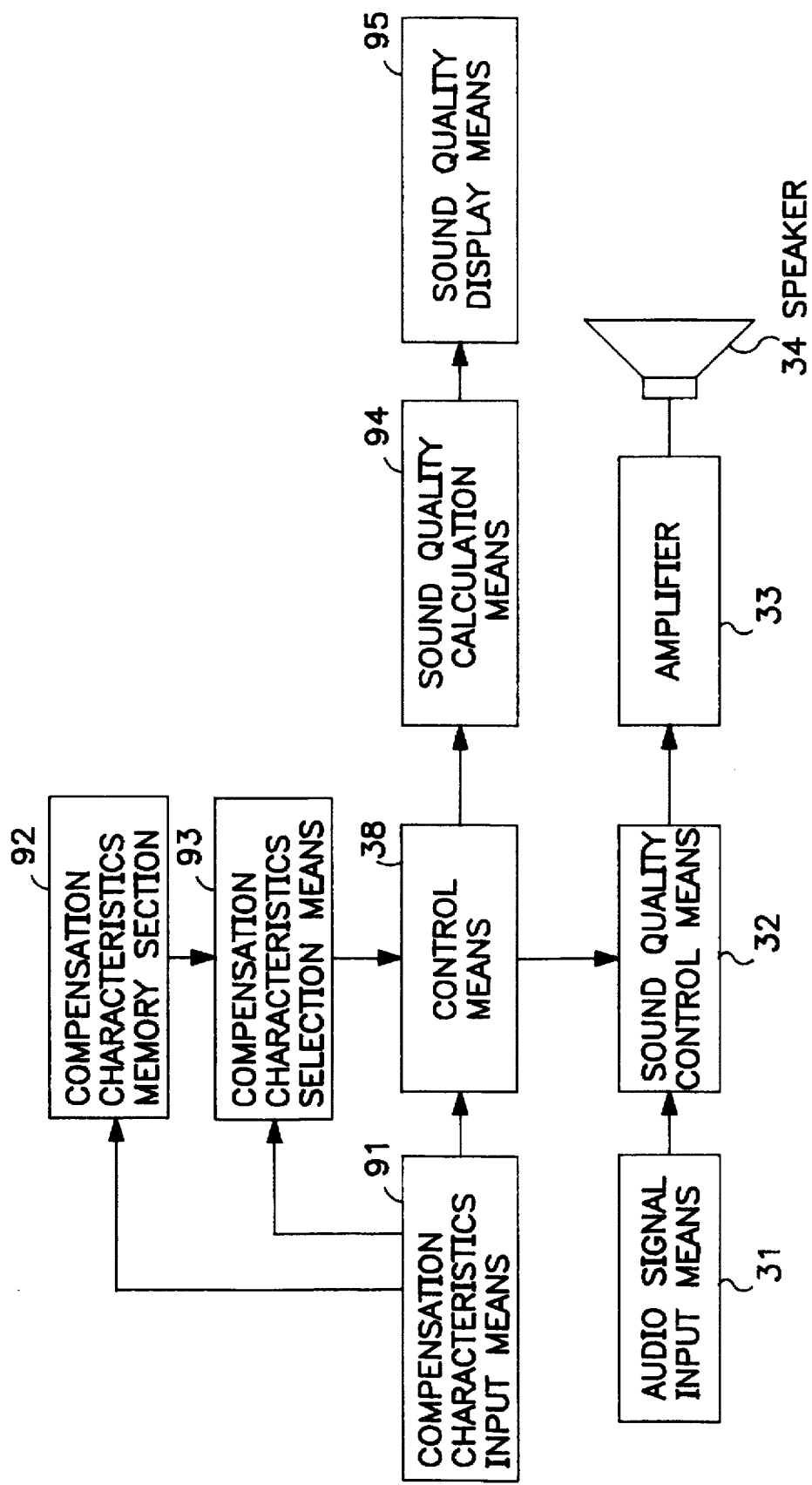
FIG. 17 is a block diagram showing basic constitution of a sound quality control system according to a fifth embodiment of the present invention.
Figure 18:
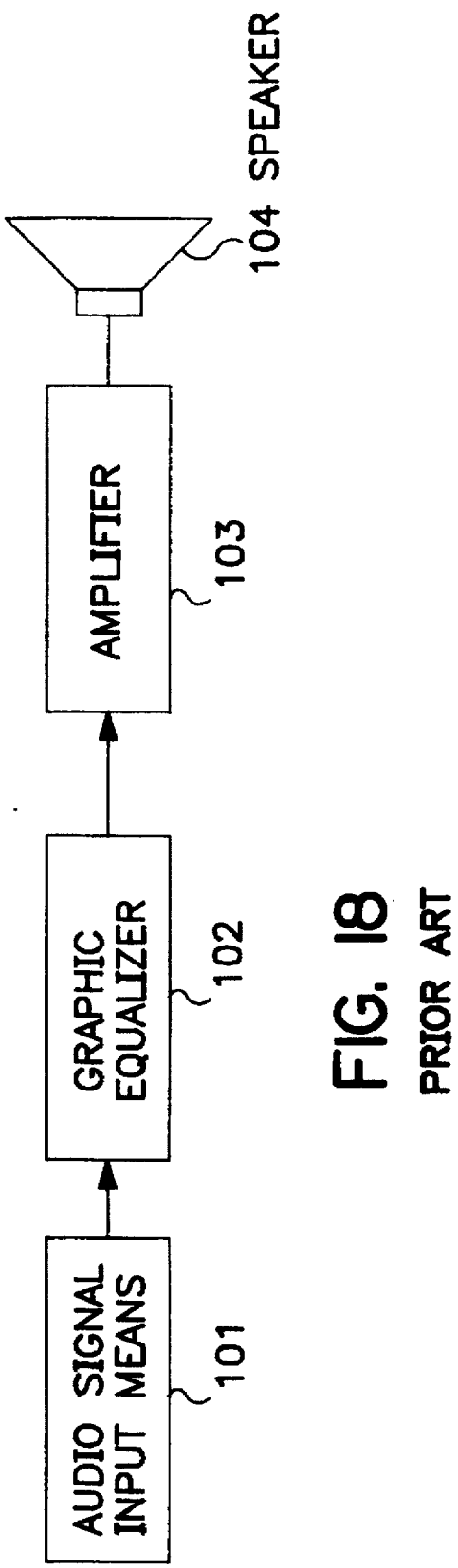
FIG. 18 is a block diagram showing basic constitution of a prior art sound quality control system.

FIG. 17 is a block diagram showing the basic constitution of a fifth embodiment of the present invention. In FIG. 17, numeral 31 denotes an audio signal input means, 32 a sound quality control means, 33 an amplifier, 34 a loudspeaker, 38 a control means, 91 a compensation characteristic input means, 92 a compensation characteristic memory section, 93 a compensation characteristics selection means, 94 a sound quality calculation means, and 95 a sound quality display means.

A listener inputs, through compensation characteristic input means 91, a compensation characteristic for controlling sound quality. When, like the case with a conventional analog graphic equalizer, the gain value and the Q value of each frequency band are input, and/or the sound pressure frequency characteristic itself is input on a CRT with a mouse, joystick, cursor key, etc. The inputted compensation characteristic is sent by control means 38 to sound quality control means 32. When, sound quality calculation means 94 quantitatively calculates how the sound quality changes under the compensation characteristic; the result is displayed in sound quality display means 95.

In the meantime, an audio signal inputted in audio signal input means 31 is controlled in sound quality by sound quality control means 32, and amplified by amplifier 33 to be reproduced through loudspeaker 34.

Whenever necessary, the listener stores the inputted compensation characteristic in compensation characteristic memory section 92. The compensation characteristic memory section is capable of recording plural compensation characteristics. When a recorded compensation characteristic is selected by compensation characteristic selection means 93, the compensation characteristic is set to sound quality control means 32 and the sound quality is controlled accordingly.

In sound quality calculation means 94, the calculation is performed by a quantitative correspondence formula between the sound quality and the physical characteristic. The correspondence formula here is a regression formula expressed as a linear primary unification of the sound quality and the physical characteristic; where, the sound quality represents a value on the psychological category scale, and the physical characteristic represents an amplitude frequency characteristic divided into plural frequency bands.

For example, suppose a regression formula regarding the feeling of powerfulness is expressed by formula (5), and a regression formula regarding the clarity is expressed by formula (6); for the sake of explanation, the physical characteristic in the formula employs only the difference in level from the mean sound pressure level.

$$Y=0.5X64+3.0X124+1.0X250-0.5X1K-0.5X2K-1.0X4K-1.0X8K \quad (5)$$

Where, Y is the psychological quantity representing the feeling of powerfulness.

X64 is the deviation level in the 64 Hz frequency band
X125 is the deviation level in the 125 Hz frequency band
X250 is the deviation level in the 250 Hz frequency band
X1K is the deviation level in the 1 KHz frequency band
X2K is the deviation level in the 2 KHz frequency band
X4K is the deviation level in the 4 KHz frequency band
X8K is the deviation level in the 8 KHz frequency band $$Z=-0.5X250-1.0X500+2.0X4K+1.0X8K+0.5X16K \quad (6)$$

Where, Z is the psychological quantity representing the clarity.

X250 is the deviation level in the 250 Hz frequency band
X500 is the deviation level in the 500 Hz frequency band
X4K is the deviation level in the 4 KHz frequency band
X8K is the deviation level in the 8 KHz frequency band
X16K is the deviation level in the 16 KHz frequency band Suppose the value of the level difference in each frequency band is, for example, −5 dB in the 64 Hz band, +2 dB in the 125 Hz band, +3 dB in the 250 Hz band, +2 dB in the 500 Hz band, −2 dB in the 1 KHz band, −1 dB in the 2 KHz band, +2 dB in the 4 KHz band, +2 dB in the 8 KHz band, and 0 dB in the 16 KHz band. Using these values of physical characteristic, the scale values regarding the feeling of powerfulness and clarity are calculated by formula (5) and formula (6); the results turn out to be 4.0 marks for the feeling of powerfulness and 2.5 marks for clarity. The calculation results are displayed in sound quality display means 95. Referring to FIG. 14 for example, the calculation results are displayed on the psychological category scale.

As described above, because the listener can visually confirm how the psychological sound quality changes when the physical characteristic is varied, the psychological effects regarding sound quality control is further enhanced, and a desired sound quality is readily realized.

In the above description, the level difference between mean sound pressure level of the whole frequency band and the level of each respective frequency band is used as the deviation level. Where the sound pressure frequency characteristic of a sound reproduction apparatus is divided into n frequency bands, the sum of the sound pressure at each of the frequency bands divided by n is regarded as the mean sound pressure level, and the difference of each frequency band from the mean sound pressure level is regarded as the deviation level. However, other differences such as the level difference between the level of each of the frequency bands and a certain fixed value of the sound pressure level, the sound pressure level at a specific frequency (e.g. 1 KHz), the largest/smallest level in each band, the mean level when the A-weighting characteristics or other compensation is applied over the whole frequency range, etc. respectively, may also be used as the deviation level.

In the descriptions, a frequency range has been divided into frequency bands at one octave interval between their center frequencies; however it is not intended to limit to such dividing.

Further, besides the sound pressure frequency characteristic, other physical characteristics such as the distortion characteristic, the phase characteristic, the transition characteristic, etc. may also be used as the physical characteristic in the present invention.

The values used in the above embodiments are of an exemplary nature, and these are not to be interpreted as limiting. The constitutions described and or shown in drawings are also of exemplary nature. Accordingly, it is intended that the patent right on the present invention be judged by the appended claims.

What is claimed is:

1. A sound quality control system comprising:

modeling means for mapping a plurality of user defined psychological values which each correspond to respective user defined sound qualities to a plurality of adjustment values which correspond to a respective plurality of frequency bands within a predetermined frequency range of a sound reproduction apparatus, wherein said modeling means comprises physical quantity input means for inputting the adjustment values for the sound reproduction apparatus, psychological quantity input means for inputting said plurality of user defined psychological values based on listener responses to a sound reproduced by said sound reproducing apparatus, correlation coefficient calculation means for calculating a correlation coefficient between said adjustment values and said psychological values, and counter model calculation means for calculating a quantitative counter-relationship between said adjustment values and said psychological values based on said calculated correlation coefficient compensation characteristics extracting means for generating a further plurality of adjustment values to adjust an audio input signal based on a difference between a further user defined sound quality and said user defined sound qualities, and signal processing means for processing said audio input signal.

2. The sound quality control system of claim 1, where a sound pressure frequency characteristic of the sound reproduction apparatus is divided into n frequency bands, a sum of a sound pressure at each of the frequency bands divided by n is a mean sound pressure level, and a respective difference of each n frequency band from said mean sound pressure level is a deviation level of said respective n frequency band;

wherein said physical quantity input means inputs as said adjustment values at least one of said respective deviation levels and an absolute value of said respective deviation level.

3. The sound quality control system of claim 1, where a scale between a pair of sound qualities is graded into a plurality of steps and each step is weighted by a respective numerical value according to a graded rank to create an appraisal scale;

wherein said psychological quantity input means inputs a value on the appraisal scale as said user defined psychological values.

4. The sound quality control system of claim 1, wherein said counter model calculation means performs a linear primary unification of the appraisal scales of the psychological values by one of plural deviation levels and the absolute value of the adjustment values, and a regression formula is formed and used as a quantitative counter model.

5. The sound quality control system of claim 1, wherein said compensation characteristics extracting means comprises:

sound quality input means for inputting a desired sound quality based on the psychological values, and compensation characteristic calculation means for calculating a compensation characteristic to determine a sound quality input from said sound quality input means based on a quantitative counter model of said adjustment values and said psychological values.

6. The sound quality control system of claim 5, wherein said compensation characteristic calculation means shifts the adjustment values in each column of the regression formula by a fixed value.

7. The sound quality control system of claim 5, wherein said compensation characteristic calculation means shifts the adjustment values in each column of the regression formula by weighting each column with a respective value of a regression coefficient.

8. The sound quality control system of claim 5, wherein said compensation characteristic calculation means shifts a control quantity in each frequency band by weighting each frequency band with a respective correlation coefficient between the adjustment value and the psychological value.

9. The sound quality control system of claim 1, wherein said compensation characteristics extracting means comprises:

sound quality input means for inputting a desired sound quality based on said psychological value, compensation characteristic calculation means for calculating a compensation characteristic to determine a sound quality input from said sound quality input means based on a quantitative counter model between said adjustment values and said psychological values, and compensation characteristic setting means for setting a compensation characteristic to determine a sound quality input from said sound quality input means.

10. The sound quality control system of claim 9, wherein said compensation characteristic calculation means shifts the adjustment value in each column of the regression formula by a fixed value.

11. The sound quality control system of claim 9, wherein said compensation characteristic calculation means shifts the adjustment values in each column of the regression formula by weighting each column with a respective value of a regression coefficient.

12. The sound quality control system of claim 9, wherein said compensation characteristic calculation means shifts a control quantity of each frequency band by weighting each frequency band with a respective correlation coefficient between adjustment value and the psychological value.

13. The sound quality control system of claim 9, wherein said compensation characteristic setting means comprises:

a memory section for recording a plurality of compensation characteristics and a respective plurality of sound qualities, and selection means for selecting one of said plurality of compensation characteristics from said memory section.

14. The sound quality control system of claim 9, wherein said compensation characteristic setting means comprises:

a memory section for recording a plurality of compensation characteristics and a respective plurality of sound qualities, selection means for selecting at least more than two of said plurality of compensation characteristics from said memory section, and interpolation means for interpolating the plurality of selected compensation characteristics and calculating a further compensation characteristic to determine the sound quality set by said sound quality input means.

15. A sound quality control system comprising:

sound quality input means for inputting at least one of a plurality of desired sound qualities based on a plurality of predetermined values, and sound quality display means for displaying said plurality of sound qualities from said sound quality input means where a scale between a pair of sound qualities is graded into a plurality of steps and each step is weighted by a respective numerical value according to a graded rank to create an appraisal scale;

wherein said sound quality input means inputs a value on the appraisal scale as the sound quality.

16. The sound quality control system of claim 15, wherein said sound quality input means inputs at least more than one sound quality.

17. The sound quality control system of claim 15, wherein said sound quality input means inputs at least more than two sound qualities each of said at least two sound qualities based on a different appraisal scale and independent to each other.

18. The sound quality control system of claim 15, wherein said sound quality display means displays at least more than one i) one-dimensional appraisal scale, and ii) two-dimensional plane and a three-dimensional space constituted by appraisal scales of more than two categories, or both of the aforementioned two, and a sound quality input from said sound quality input means.

19. A sound quality control system comprising:

sound quality input means for inputting at least one of a plurality of desired sound qualities based on a plurality of predetermined values, a sound quality memory section for recording said plurality of desired sound qualities, sound quality selection means for selecting said recorded sound quality, and sound quality display means for displaying said plurality of sound qualities from said sound quality input means, where a scale between a pair of sound qualities is graded into a plurality of steps and each step is weighted by a respective numerical value according to a graded rank to create an appraisal scale;

wherein said sound quality input means inputs a value on the appraisal scale as the sound quality.

20. The sound quality control system of claim 19, wherein said sound quality input means inputs at least more than one sound quality.

21. The sound quality control system of claim 19 wherein said sound quality input means inputs at least more than two sound qualities each of said at least two sound qualities on a different appraisal scale and independent to each other.

22. The sound quality control system of claim 19, wherein said sound quality display means displays at least more than one i) one-dimensional appraisal scale, and ii) a two-dimensional plane and a three-dimensional space constituted by appraisal scales of more than two categories, or both of the aforementioned two, and a sound quality input from said sound quality input means.

23. A sound quality control system comprising:

sound quality input means for inputting a desired sound quality, a sound quality memory section for recording said desired sound quality, sound quality selection means for selecting said recorded sound quality, sound quality display means for displaying said plurality of sound qualities from said sound quality input means, and compensation characteristic display means for displaying a compensation characteristic responsive to the desired sound quality, where a scale between a pair of sound qualities is graded into a plurality of steps and each step is weighted by a respective numerical value according to a graded rank to create an appraisal scale;

wherein said sound quality input means inputs a value on the appraisal scale as the sound quality.

24. The sound quality control system of claim 23, wherein said sound quality input means inputs at least more than one sound quality.

25. The sound quality control system of claim 23, wherein said sound quality input means inputs at least more than two sound qualities each of said at least two sound qualities based on a different appraisal scale and independent to each other.

26. The sound quality control system of claim 23, wherein said sound quality display means displays at least more than one i) one-dimensional appraisal scale, and ii) a two-dimensional plane and a three-dimensional space constituted by appraisal scales of more than two categories, or both of the aforementioned two, and a sound quality input from said sound quality input means.

27. A sound quality control system for use with an audio input signal comprising:

compensation input means for inputting a compensation characteristic to adjust the audio input signal, a compensation memory for recording said compensation characteristic, compensation selection means for selecting said recorded compensation characteristic, said compensation selection means coupled to said compensation input means and said compensation memory, sound quality control means for receiving said audio input signal, control means for controlling said sound quality control means based on an output of said compensation selection means, sound quality calculation means for calculating a sound quality based on data of said compensation characteristic, and sound quality display means for displaying said calculated sound quality.

28. The sound quality control system of claim 27, wherein said compensation input means inputs a datum for compensating an amplitude frequency characteristic of the audio input signal.

29. The sound quality control system of claim 27, wherein said sound quality calculation means calculates a sound quality using a regression formula in which the sound quality is represented in a form of a linear primary unification of a plurality of adjustment values.

30. The sound quality control system of claim 29, where a scale between a pair of sound qualities is graded into a plurality of steps and each step is weighted by a respective numerical value according to a graded rank to create an appraisal scale;

wherein said regression formula treats a value on the appraisal scale as the sound quality.

31. The sound quality control system of claim 29, where the amplitude frequency characteristic of the compensation characteristic input from said compensation input means is divided into n frequency bands, a sum of a sound pressure at each of the n frequency bands divided by n is a mean sound pressure level;

wherein said regression formula is applied to at least one of i) a difference in sound pressure at each n frequency band and said mean sound pressure level and ii) the absolute value thereof as the adjustment value.

32. The sound quality control system of claim 27, wherein said sound quality display means displays at least more than one i) one-dimensional appraisal scale, and ii) two-dimensional plane and, iii) a three-dimensional space constituted by appraisal scales of more than two categories, or both of the aforementioned two, and a sound quality input from said sound quality input means.

* * * * *

UNITED STATES PATENT AND TRADE MARK OFFICE
CERTIFICATE OF CORRECTION

PATENT NO. : 5,745,586
DATED : April 28, 1998
INVENTOR(S) : Tagami et al.

It is certified that error appears in the above-identified patent and that said Letters Patent is hereby corrected as shown below:

On the cover page, item [56] References Cited, FOREIGN PATENT DOCUMENTS, "41 21 628 3/1992 United Kingdom" should be --41 21628 3/1992 Germany--.

Signed and Sealed this

Thirteenth Day of October 1998

Attest:

BRUCE LEHMAN

*Attesting Officer*  *Commissioner of Patents and Trademarks*